(12) United States Patent
Ohhashi

(10) Patent No.: US 8,605,029 B2
(45) Date of Patent: Dec. 10, 2013

(54) SHIFT REGISTER, DISPLAY DEVICE PROVIDED WITH SAME, AND METHOD OF DRIVING SHIFT REGISTER

(75) Inventor: Seiji Ohhashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 60 days.

(21) Appl. No.: 13/379,589

(22) PCT Filed: Mar. 1, 2010

(86) PCT No.: PCT/JP2010/053237
§ 371 (c)(1),
(2), (4) Date: Dec. 20, 2011

(87) PCT Pub. No.: WO2010/150574
PCT Pub. Date: Dec. 29, 2010

(65) Prior Publication Data
US 2012/0098804 A1    Apr. 26, 2012

(30) Foreign Application Priority Data

Jun. 25, 2009    (JP) .................................. 2009-150483

(51) Int. Cl.
*G09G 3/36*    (2006.01)
(52) U.S. Cl.
USPC .................. 345/100; 345/87; 345/98; 377/64
(58) Field of Classification Search
USPC ............. 345/66, 87, 98, 100, 204; 377/64–81
See application file for complete search history.

(56) References Cited

U.S. PATENT DOCUMENTS

| 4,446,567 A | 5/1984 | Iida et al. |
| 5,222,082 A | 6/1993 | Plus |
| 2004/0173795 A1 | 9/2004 | Moon et al. |

(Continued)

FOREIGN PATENT DOCUMENTS

| JP | 56-124195 A | 9/1981 |
| JP | 62-234298 A | 10/1987 |

(Continued)

OTHER PUBLICATIONS

International Search Report.

*Primary Examiner* — Koosha Sharifi-Tafreshi
(74) *Attorney, Agent, or Firm* — Harness, Dickey & Pierce, P.L.C.

(57) ABSTRACT

A display device is implemented that can suppress degradation in display quality caused by crosstalk, without causing an increase in frame size or an increase in power consumption. In an embodiment, each bistable circuit includes an output terminal that outputs a state signal; a thin film transistor having a drain terminal to which a high-level potential is provided, and a source terminal to which the output terminal is connected; a thin film transistor having a source terminal connected to a region netA connected to a gate terminal of the thin film transistor, and a gate terminal to which a clock is provided; a thin film transistor for increasing the potential of a region netZ connected to a drain terminal of the thin film transistor; and thin film transistors for decreasing the potentials of the netA, the netZ, and the output terminal, respectively.

13 Claims, 17 Drawing Sheets

(56) References Cited

U.S. PATENT DOCUMENTS

| | | |
|---|---|---|
| 2004/0189585 A1* | 9/2004 | Moon ............................ 345/100 |
| 2004/0253781 A1 | 12/2004 | Kimura et al. |
| 2005/0145849 A1 | 7/2005 | Moon et al. |
| 2006/0001637 A1* | 1/2006 | Pak et al. ....................... 345/100 |
| 2007/0132686 A1 | 6/2007 | Kimura et al. |
| 2008/0143666 A1* | 6/2008 | Wei et al. ...................... 345/100 |
| 2009/0109162 A1 | 4/2009 | Moon et al. |

FOREIGN PATENT DOCUMENTS

| | | |
|---|---|---|
| JP | 06-505605 A | 6/1994 |
| JP | 2004-222256 A | 8/2004 |
| JP | 2004-274050 A | 9/2004 |
| JP | 2009-205707 A | 9/2009 |

\* cited by examiner

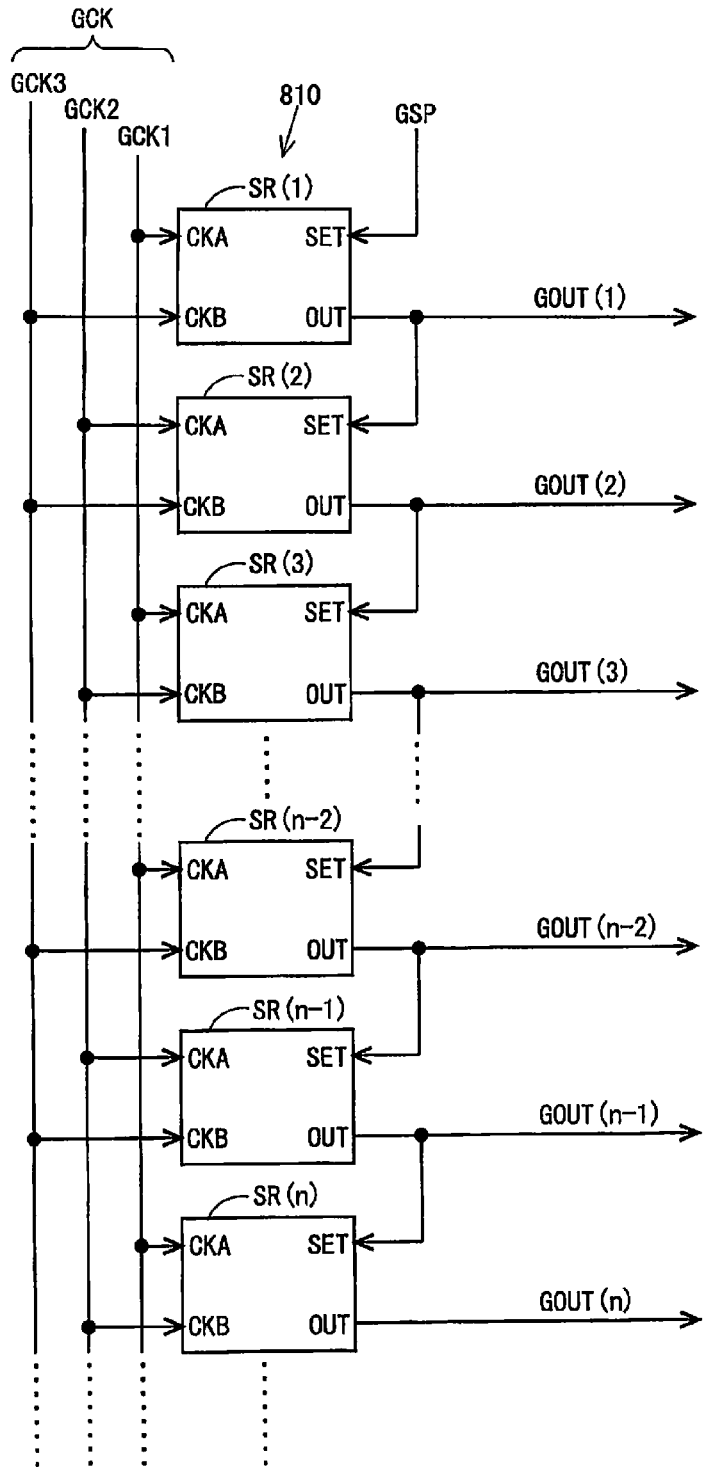
Fig.8
Conventional

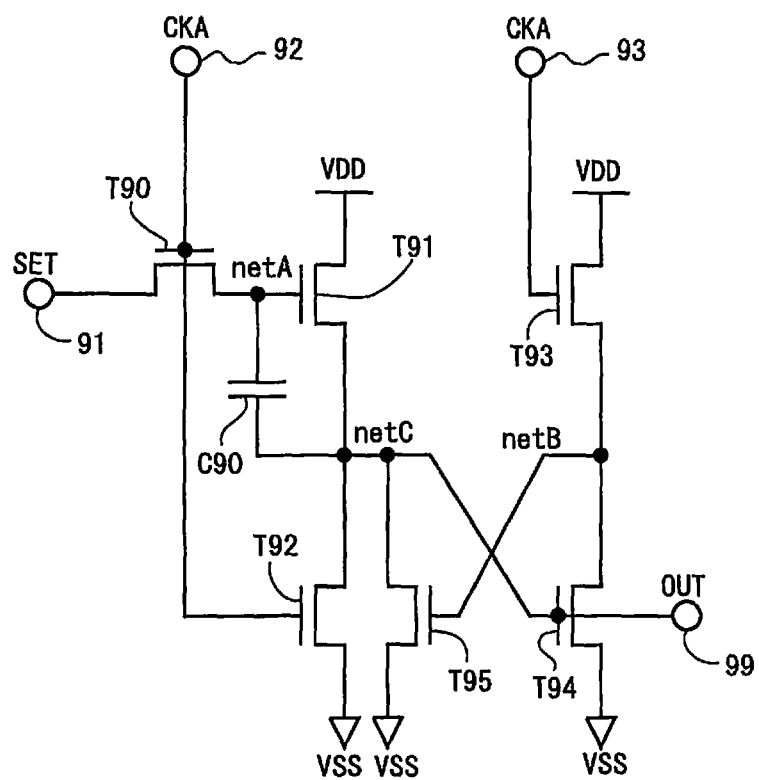
Fig.13
Conventional

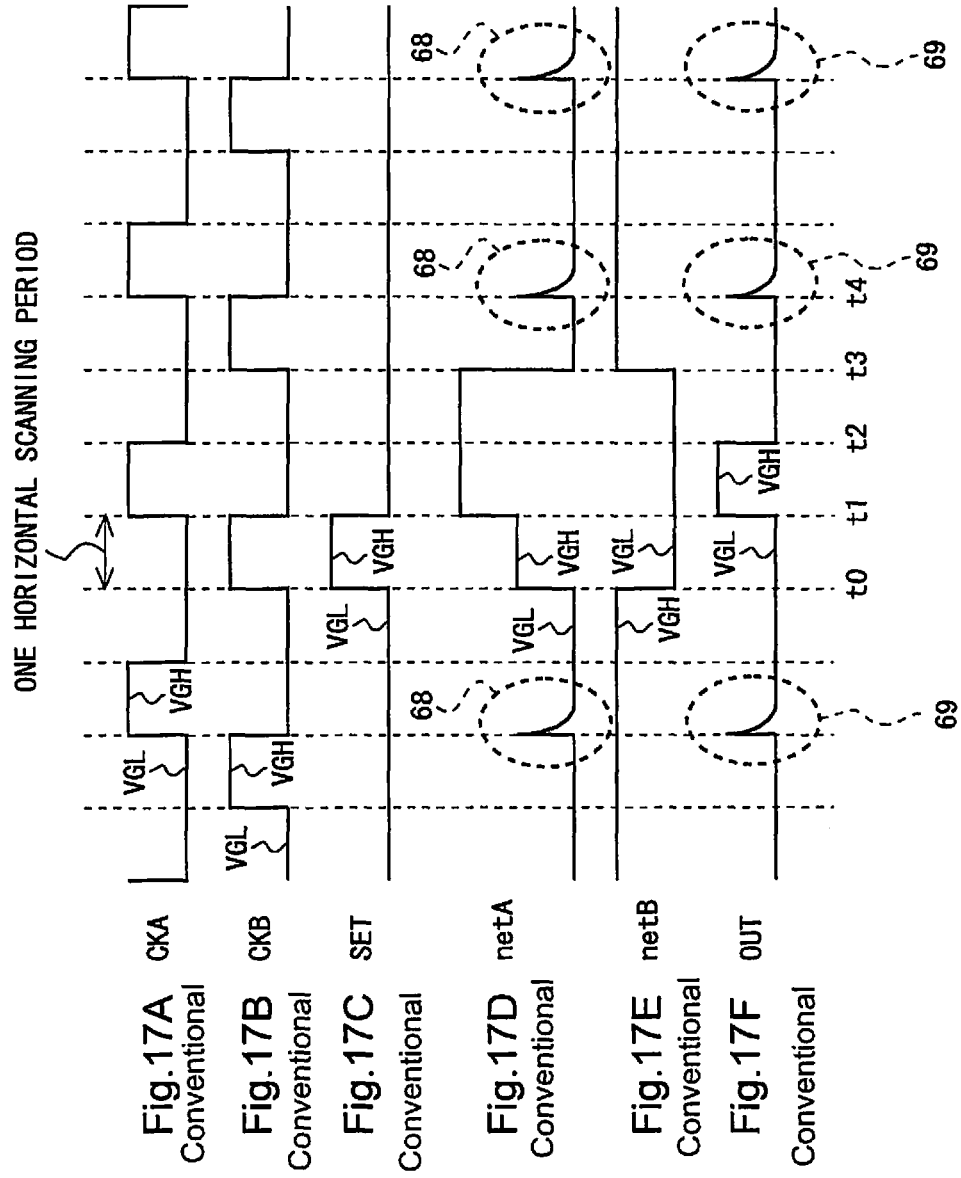

SHIFT REGISTER, DISPLAY DEVICE PROVIDED WITH SAME, AND METHOD OF DRIVING SHIFT REGISTER

TECHNICAL FIELD

The present invention relates to a shift register provided in a drive circuit of an active matrix-type display device and a method of driving the shift register.

BACKGROUND ART

Conventionally, there is known an active matrix-type display device in which a plurality of gate bus lines (scanning signal lines) and a plurality of source bus lines (video signal lines) are arranged in a grid pattern and a plurality of pixel formation portions are arranged in a matrix form at the respective intersections of the plurality of gate bus lines and the plurality of source bus lines. Each pixel formation portion includes a TFT (Thin Film Transistor) which is a switching element connected at its gate terminal to a gate bus line passing through a corresponding intersection, and connected at its source terminal to a source bus line passing through the intersection; a pixel capacitance for holding a pixel value; and the like. The active matrix-type display device is also provided with a gate driver (scanning signal line drive circuit) that drives the plurality of gate bus lines, and a source driver (video signal line drive circuit) that drives the plurality of source bus lines.

A video signal indicating a pixel value is transmitted through a source bus line, and each source bus line cannot transmit video signals indicating pixel values for a plurality of rows at a time (at the same time). Therefore, writing of video signals to the pixel capacitances in the above-described pixel formation portions arranged in a matrix form is sequentially performed row by row. Hence, in order that the plurality of gate bus lines can be sequentially selected for a predetermined period, the gate driver is composed of a shift register including a plurality of stages.

FIG. 8 is a block diagram showing an exemplary configuration of a shift register 810 included in a conventional gate driver (see Published Japanese Translation of PCT Application No. 6-505605). As shown in FIG. 8, the gate driver is composed of the n-stage shift register 810. Each stage of the shift register 810 is a bistable circuit which is in either one of two states (a first state and a second state) at each time point and outputs a signal (state signal) indicating the state, as a scanning signal GOUT. As such, the shift register 810 is composed of n bistable circuits SR(1) to SR(n). To the shift register 810 are provided three-phase clock signals GCK1, GCK2, and GCK3 and a gate start pulse signal GSP which is a signal for starting scanning of gate bus lines. Each bistable circuit is provided with an input terminal for receiving any one of the three-phase clock signals as a first clock CKA; an input terminal for receiving any one of the three-phase clock signals as a second clock CKB; an input terminal for receiving the gate start pulse signal GSP or a state signal OUT outputted from its previous stage, as a set signal SET; and an output terminal for outputting a state signal OUT.

FIG. 9 is a circuit diagram showing an exemplary configuration of one stage (one bistable circuit) of the above-described conventional shift register 810. The bistable circuit includes six thin film transistors T81 to T86 and a capacitor C81. In addition, the bistable circuit has input terminals for a power supply line VDD which supplies a relatively high-level potential VGH and input terminals for a power supply line VSS which supplies a relatively low-level potential VGL, and three input terminals 81 to 83 and one output terminal 89. Note that the input terminal that receives a first clock CKA is denoted by a reference numeral 81, the input terminal that receives a set signal SET is denoted by a reference numeral 82, and the input terminal that receives a second clock CKB is denoted by a reference numeral 83. Note also that the potential VGH corresponds to a potential that places a thin film transistor in a pixel formation portion in an on state, and the potential VGL corresponds to a potential that places the thin film transistor in an off state.

The gate terminal of the thin film transistor T81, the source terminal of the thin film transistor T82, and the drain terminal of the thin film transistor T83 are connected to one another. Note that a region (wiring line) where they are connected to one another is referred to as a "netA" for convenience' sake. In addition, the gate terminal of the thin film transistor T83, the gate terminal of the thin film transistor T84, the source terminal of the thin film transistor T85, and the drain terminal of the thin film transistor T86 are connected to one another. Note that a region (wiring line) where they are connected to one another is referred to as a "netB" for convenience' sake.

The thin film transistor T81 is connected at its gate terminal to the netA, connected at its drain terminal to the input terminal 81, and connected at its source terminal to the output terminal 89. The thin film transistor T82 is connected at its gate terminal to the input terminal 82, connected at its drain terminal to the power supply line VDD, and connected at its source terminal to the netA. The thin film transistor T83 is connected at its gate terminal to the netB, connected at its drain terminal to the netA, and connected at its source terminal to the power supply line VSS. The thin film transistor T84 is connected at its gate terminal to the netB, connected at its drain terminal to the output terminal 89, and connected at its source terminal to the power supply line VSS. The thin film transistor T85 is connected at its gate terminal to the input terminal 83, connected at its drain terminal to the power supply line VDD, and connected at its source terminal to the netB. The thin film transistor T86 is connected at its gate terminal to the input terminal 82, connected at its drain terminal to the netB, and connected at its source terminal to the power supply line VSS. The capacitor C81 is connected at its one end to the netA and connected at its other end to the output terminal 89.

In a configuration such as that described above, three-phase clock signals GCK1, GCK2, and GCK3 having waveforms shown in FIGS. 10A to 10C and a gate start pulse signal GSP having a waveform shown in FIG. 10D are provided to the shift register 810. Then, scanning signals GOUT(1) to GOUT(n) which sequentially go to a high level for one horizontal scanning period as shown in FIGS. 10E to 10G are outputted from the shift register 810.

With reference to FIGS. 9 and 11A to 11F, the operation of each stage (bistable circuit) of the shift register 810 will be described below. Note that FIGS. 11A to 11F show waveforms for the bistable circuit SR(1) of the first stage, and for the bistable circuits SR(2) to SR(n) of the second and subsequent stages, the same waveforms as those shown in FIGS. 11A to 11F appear delayed by one horizontal scanning period. In other words, the n bistable circuits SR(1) to SR(n) perform the same operation with the exception of timing. Accordingly, in the following, description will be made focusing only on the bistable circuit SR(1) of the first stage.

During the operation of the display device, a first clock CKA having a waveform shown in FIG. 11A is provided to the input terminal 81, and a second clock CKB having a waveform shown in FIG. 11B is provided to the input terminal 83. During periods before time point t0, the potentials of a set signal SET, a netA, and a state signal OUT are VGL and the potential of a netB is VGH.

When reaching time point t0, a pulse of the set signal SET is provided to the input terminal 82. Accordingly, the thin film transistors T82 and T86 are placed in an on state (conducting state). In addition, at time point t0, the potential of the second clock CKB provided to the input terminal changes from VGL to VGH. Accordingly, the thin film transistor T85 is placed in an on state. By the thin film transistor T82 being placed in an on state, the potential of the netA is brought to VGH and thus the thin film transistor T81 is placed in an on state. In addition, the thin film transistor T85 is placed in an on state and the thin film transistor T86 is also placed in an on state and thus a current flows from the drain terminal of the thin film transistor T85 to the source terminal of the thin film transistor T86. Hence, the potential of the netB is brought to VGL. Accordingly, the thin film transistors T83 and T84 are placed in an off state (non-conducting state). By the thin film transistor T83 being placed in an off state, the potential of the netA does not decrease during the period from t0 to t1.

The thin film transistor T81 is, as described above, placed in an on state at time point t0, but the potential of the first clock CKA provided to the input terminal 81 is VGL during the period from t0 to t1. Hence, the potential of the state signal OUT outputted from the output terminal 89 is maintained at VGL. At this time, a voltage with the magnitude "VGH-VGL" is applied between the gate and source of the thin film transistor T81 (between the two terminals of the capacitor C81).

When reaching time point t1, the potentials of the set signal SET and the second clock CKB change from VGH to VGL. Accordingly, the thin film transistors T82, T85, and T86 are placed in an off state. In addition, at time point t1, the potential of the first clock CKA changes from VGL to VGH. At this time, since the voltage between the gate and source of the thin film transistor T81 is maintained at "VGH-VGL" by the capacitor C81, the thin film transistor T81 is in an on state. In addition, a parasitic capacitance (not shown) is formed between the gate and drain of the thin film transistor T81. Due to the above, the drain potential of the thin film transistor T81 increases with an increase in potential at the input terminal 81, and thus, the potential of the netA further increases from VGH through the parasitic capacitance. As a result, a large voltage is applied to the gate terminal of the thin film transistor T81 and thus the potential of the state signal OUT increases to the potential VGH of the first clock CKA. Accordingly, a gate bus line connected to the output terminal 89 of the bistable circuit is placed in a selected state. Meanwhile, during the period from t1 to t2, since the thin film transistor T85 is in an off state, the potential of the netB is maintained at VGL. Hence, during this period, the thin film transistor T83 is maintained in an off state and thus the potential of the netA is also maintained. Note that for the increase in the potential of the netA at time point t1, the potential ideally increases to a level twice the VGH, but in practice the potential does not increase to the level twice the VGH due to the presence of the parasitic capacitances, resistances, etc., of the netA, the input terminal 81, the output terminal 89, and the thin film transistor T81.

When reaching time point t2, the potential of the first clock CKA changes from VGH to VGL. At time point t2, since the potential of the netA is higher than VGH, when the drain potential of the thin film transistor T81 decreases with a decrease in potential at the input terminal 81, a current flows from the source terminal to drain terminal of the thin film transistor T81. Accordingly, the potential at the output terminal 89, i.e., the potential of the state signal OUT, decreases to VGL. Accordingly, the gate bus line connected to the output terminal 89 of the bistable circuit is placed in a non-selected state. Note that during the period from t2 to t3, since the potential of the second clock CKB is VGL and thus the thin film transistor T85 is in an off state, the potential of the netB is maintained at VGL. Hence, during this period, the thin film transistor T83 is maintained in an off state and the potential of the netA is also maintained.

When reaching time point t3, the potential of the second clock CKB changes from VGL to VGH. Hence, the thin film transistor T85 is placed in an on state. Accordingly, the potential of the netB is brought to VGH and thus the thin film transistors T83 and T84 are placed in an on state. By the thin film transistor T83 being placed in an on state, the potential of the netA is brought to VGL and thus the thin film transistor T81 is placed in an off state. In addition, by the thin film transistor T84 being placed in an on state, the potential of the state signal OUT is maintained at VGL.

The operation such as that described above is sequentially performed at the n bistable circuits SR (1) to SR (n) such that the timing is delayed by one horizontal scanning period. Accordingly, in each frame period, n gate bus lines GL1 to GLn are sequentially placed in a selected state for one horizontal scanning period.

As another example, the case in which a shift register circuit disclosed in Japanese Patent Application Laid-Open No. 62-234298 is applied to a gate driver of a display device will be described with reference to FIGS. 12, 13, 14A to 14J, and 15A to 15D. FIG. 12 is a block diagram showing a configuration of a shift register 910 included in the gate driver. As shown in FIG. 12, the shift register 910 is composed of n bistable circuits SR(1) to SR(n). To the shift register 910 are provided two-phase clock signals GCK1 and GCK2 and a gate start pulse signal GSP which is a signal for starting scanning of gate bus lines. Each bistable circuit is provided with an input terminal for receiving either one of the two-phase clock signals as a first clock CKA; an input terminal for receiving the gate start pulse signal GSP or a state signal OUT outputted from its previous stage, as a set signal SET; and an output terminal for outputting a state signal OUT.

FIG. 13 is a circuit diagram showing a configuration of one stage (one bistable circuit) of the shift register 910. The bistable circuit includes six thin film. transistors T90 to T95 and a capacitor C90. In addition, the bistable circuit has input terminals for a power supply line VDD which supplies a relatively high-level potential VGH and input terminals for a power supply line VSS which supplies a relatively low-level potential VGL, and three input terminals 91 to 93 and one output terminal 99. Note that the input terminal that receives a set signal SET is denoted by a reference numeral 91, one of the input terminals that receive a first clock CKA is denoted by a reference numeral 92, and the other one of the input terminals that receive a first clock CKA is denoted by a reference numeral 93.

The source terminal of the thin film transistor T90, the gate terminal of the thin film transistor T91, and one end of the capacitor C90 are connected to one another. Note that a region (wiring line) where they are connected to one another is referred to as a "netA" for convenience's sake. In addition, the source terminal of the thin film transistor T93, the drain terminal of the thin film transistor T94, and the gate terminal of the thin film transistor T95 are connected to one another. Note that a region (wiring line) where they are connected to one another is referred to as a "netB" for convenience's sake. Furthermore, the source terminal of the thin film transistor T91, the drain terminal of the thin film transistor T92, the gate terminal of the thin film transistor T94, the drain terminal of the thin film transistor T95, and the other end of the capacitor C90 are connected to one another. Note that a region (wiring line) where they are connected to one another is referred to as a "netC" for convenience's sake.

The thin film transistor T90 is connected at its gate terminal to the input terminal 92, connected at its drain terminal to the input terminal 91, connected at its source terminal to the netA. The thin film transistor T91 is connected at its gate terminal to the netA, connected at its drain terminal to the power supply line VDD, and connected at its source terminal to the netC. The thin film transistor T92 is connected at its gate terminal to the input terminal 92, connected at its drain terminal to the netC, and connected at its source terminal to the power supply line VSS. The thin film transistor T93 is connected at its gate terminal to the input terminal 93, connected at its drain terminal to the power supply line VDD, and connected at its source terminal to the netB. The thin film transistor T94 is connected at its gate terminal to the netC and the output terminal 99, connected at its drain terminal to the netB, and connected at its source terminal to the power supply line VSS. The thin film transistor T95 is connected at its gate terminal to the netB, connected at its drain terminal to the netC, and connected at its source terminal to the power supply line VSS. The capacitor C90 is connected at its one end to the netA and connected at its other end to the netC.

In a configuration such as that described above, two-phase clock signals GCK1 and GCK2 having waveforms shown in FIGS. 14A and 14B and a gate start pulse signal GSP having a waveform shown in FIG. 14C are provided to the shift register 910. Then, scanning signals GOUT(1) to GOUT(n) which sequentially go to a high level for one horizontal scanning period as shown in FIGS. 14D to 14J are outputted from the shift register 910.

With reference to FIGS. 13, 14A to 14J, and 15A to 15D, the operation of each stage (bistable circuit) of the shift register 910 will be described below. Note that FIGS. 15A to 15D show waveforms for the bistable circuit SR (1) of the first stage, and for the bistable circuits SR (2) to SR (n) of the second and subsequent stages, the same waveforms as those shown in FIGS. 15A to 15D appear delayed by one horizontal scanning period. In other words, the n bistable circuits SR (1) to SR (n) perform the same operation with the exception of timing. Accordingly, in the following, description will be made focusing only on the bistable circuit SR (1) of the first stage.

During the operation of the display device, a first clock CKA having a waveform shown in FIG. 15A is provided to the input terminal 91. During periods before time point t0, the potentials of a set signal SET, a netA, and a state signal OUT are VGL.

When reaching time point t0, the potential of the first clock CKA changes from VGL to VGH. Accordingly, the thin film transistors T90, T92, and T93 are placed in an on state. By the thin film transistor T93 being placed in an on state, the potential of the netB increases to the potential VGH of the power supply line VDD and thus the thin film transistor T95 is placed in an on state. In addition, at time point t0, the potential of the set signal SET changes from VGL to VGH. Since, as described above, the thin film transistor T90 is placed in an on state, the potential of the netA increases to the potential VGH of the set signal SET. At this time, since the voltage between the gate and source of the thin film transistor T91 (between the two terminals of the capacitor C90) is "VGH-VGL", the thin film transistor T91 is placed in an on state. However, since the thin film transistors T92 and T95 are in an on state, the potential at the output terminal 99 (the potential of the state signal OUT) is maintained at VGL.

When reaching time point t1, the potentials of the set signal SET and the first clock CKA change from VGH to VGL. Accordingly, the thin film transistors T90, T92, T93, and T95 are placed in an off state. At this time, the voltage between the gate and source of the thin film transistor T91 is maintained at "VGH-VGL" by the capacitor C90. Hence, the thin film transistor T91 is maintained in an on state. Here, since, as described above, the thin film transistors T92 and T95 are in an off state, a current does not flow between the drain and source of each of the thin film transistors T92 and T95 and thus the potential at the output terminal 99 increases to the potential VGH of the power supply line VDD. Accordingly, a gate bus line connected to the output terminal 99 of the bistable circuit is placed in a selected state.

When reaching time point t2, the potential of the first clock CKA changes from VGL to VGH. Accordingly, the thin film transistors T90, T92, T93, and T95 are placed in an on state. At this time, since the potential of the set signal SET is VGL, the potential of the netA decreases from VGH to VGL and thus the thin film transistor T91 is placed in an off state. In addition, since, as described above, the thin film transistors T92 and T95 are in an on state, charge accumulated in the netC flows through the power supply lines VSS via the thin film transistors T92 and T95 and thus the potential at the output terminal 99 decreases from VGH to VGL.

The operation such as that described above is sequentially performed at the above-described n bistable circuits SR(1) to SR(n) such that the timing is delayed by one horizontal scanning period. Accordingly, in each frame period, n gate bus lines GL1 to GLn are sequentially placed in a selected state for one horizontal scanning period.

PRIOR ART DOCUMENTS

Patent Documents

[Patent Document 1] Published Japanese Translation of PCT Application No. 6-505605
[Patent Document 2] Japanese Patent Application Laid-Open No. 62-234298

SUMMARY OF THE INVENTION

Problems to be Solved by the Invention

According to the configuration disclosed in Published Japanese Translation of PCT Application No. 6-505605 (see FIG. 9), however, crosstalk may occur due to a change in the potential of a clock signal provided to the shift register and overlap capacitance in a thin film transistor. This will be described below.

FIG. 16 is a cross-sectional view of a general amorphous silicon TFT 70. As shown in FIG. 16, the amorphous silicon TFT 70 is composed of a gate electrode 71 formed on a glass substrate (not shown); a gate insulating film 72 formed to cover the gate electrode 71; an amorphous silicon 73 formed on the gate insulating film 72; n+ amorphous silicons 74 formed on the amorphous silicon 73; a drain electrode 75 and a source electrode 76 which are formed on the n+ amorphous silicons 74, respectively; and a protective film 77 formed on the drain electrode 75 and the source electrode 76. Here, in a region denoted by a reference numeral 78 in FIG. 16, the source electrode 76 and the gate electrode 71 overlap each other in a planar view (the source electrode 76 and the gate electrode 71 are disposed one above the other with the gate insulating film 72, etc., therebetween), and thus, an overlap capacitance Cgs occurs between the source electrode 76 and the gate electrode 71. Likewise, in a region denoted by a reference numeral 79 in FIG. 16, an overlap capacitance Cgd occurs between the drain electrode 75 and the gate electrode 71. Note that the magnitudes of the overlap capacitances Cgs and Cgd are normally proportional to their channel areas. More specifically, when, of the channel length, the length denoted by the reference numeral 78 in FIG. 16 is Lgs, the length denoted by the reference numeral 79 is Lgd, and the channel width is W, the magnitude of the overlap capacitance Cgs is proportional to "W×Lgs" and the magnitude of the overlap capacitance Cgd is proportional to "W×Lgd".

Now, in the configuration shown in FIG. 9, the thin film transistor T81 is focused on. The potential of a first clock CKA is provided to the drain terminal of the thin film transistor T81. As shown in FIG. 11A, the duty ratio of the first clock CKA (the "duty ratio" as used herein refers to the ratio of a period during which a high-level potential is maintained to a cycle in which a high-level potential and a low-level potential are repeated) is one third. In other words, the potential of the first clock CKA is brought to VGH (high level) not only during a period during which a gate bus line connected to the output terminal 89 of the bistable circuit including the thin film transistor T81 is to be placed in a selected state, but is brought to VGH every three horizontal scanning periods throughout the periods during which the display device operates.

Meanwhile, when the potential of the first clock CKA changes from VGL to VGH, the drain potential of the thin film transistor T81 increases, and thus, the potential of the netA increases through an overlap capacitance Cgd in the thin film transistor T81. However, since, as shown in FIG. 11E, during periods other than the period from t0 to t3, the potential of the netB is VGH and thus the thin film transistor T83 is in an on state, the potential of the netA immediately decreases to VGL, as indicated by a reference numeral 68 in FIG. 17D. However, when the voltage between the gate and source of the thin film transistor T81 becomes larger than a threshold voltage due to such an increase in the potential of the netA, the thin film transistor T81 is placed in an on state. Accordingly, as indicated by a reference numeral 69 in FIG. 17F, the potential of a state signal OUT temporarily goes to a high level during periods other than a selected period (a period during which a gate bus line connected to an output terminal of each bistable circuit is to be placed in a selected state). Then, thin film transistors in pixel formation portions connected to the gate bus line through which the high-level state signal OUT is transmitted are placed in an on state. In this manner, crosstalk occurs in the display device, degrading display quality. Note that such a phenomenon occurs not only in a shift register having the configuration shown in FIG. 9, but can occur in a shift register having a configuration in which a driving clock signal (the first clock CKA in the example shown in FIG. 9) is provided to the other conducting terminal of an output transistor (a transistor which is connected at its one conducting terminal to an output terminal in a bistable circuit and which controls the potential of a state signal by fluctuating a potential at a control terminal of the transistor).

In addition, according to the configuration disclosed in Japanese Patent Application Laid-Open No. 62-234298 (see FIG. 13), a constant high-level potential VDD but not a driving clock signal is provided to the drain terminal of the thin film transistor T91 functioning as an output transistor. Hence, crosstalk due to fluctuations in the drain potential of the thin film transistor T91 does not occur in the display device. However, since the thin film transistor T91 is placed in an on state throughout one horizontal scanning period immediately before a selected period, a current flowing from the power supply line VDD to the netC through the thin film transistor T91 needs to flow through the power supply lines VSS via the thin film transistors T92 and T95 during a period before the selected period starts. To do so, the channel areas of the thin film transistors T92 and T95 need to be increased, resulting in an increase in the size of a frame for mounting a gate driver. In addition, since a current unnecessarily flows via the thin film transistors T92 and T95 during a horizontal scanning period immediately before the selected period, power consumption increases.

An object of the present invention is therefore to implement a display device capable of suppressing degradation in display quality caused by crosstalk, without causing an increase in frame size or an increase in power consumption.

Means for Solving the Problems

A first aspect of the present invention is directed to a shift register comprising a plurality of bistable circuits having a first state and a second state and connected in series with each other, the plurality of bistable circuits being sequentially placed in the first state based on two-phase clock signals including a first and a second clock signal, the first and second clock signals being provided from an external source of each bistable circuit and periodically repeating a high-level potential and a low-level potential, wherein
  each bistable circuit includes:
    an output node that outputs a state signal indicating either one of the first state and the second state;
    a first transistor having a second electrode to which a high-level potential is provided, and a third electrode connected to the output node;
    a second transistor having a first electrode to which the first clock signal is provided, and a third electrode connected to a first node connected to a first electrode of the first transistor;
    a second node charge portion for charging a second node based on a state signal outputted from a bistable circuit of a previous stage of the bistable circuit, the second node being connected to a second electrode of the second transistor;
    a second node discharge portion for discharging the second node based on a state signal outputted from a bistable circuit of a subsequent stage of the bistable circuit;
    a first node discharge portion for discharging the first node based on the second clock signal; and
    an output node discharge portion for discharging the output node based on the second clock signal.
  According to a second aspect of the present invention, in the first aspect of the present invention,
    a channel area of the first transistor is larger than that of the second transistor.
  According to a third aspect of the present invention, in the first aspect of the present invention,
    each bistable circuit further includes a capacitor connected at its one end to the second node and connected at its other end to the output node.
  According to a fourth aspect of the present invention, in the first aspect of the present invention,
    in each bistable circuit,
      the second node discharge portion includes a third transistor having a first electrode to which a state signal outputted from a bistable circuit of a subsequent stage of the bistable circuit is provided, a second electrode to which the second node is connected, and a third electrode to which a low-level potential is provided, the first node discharge portion includes a fourth transistor having a first electrode to which the second clock signal is provided, a second electrode to which the first node is connected, and a third electrode to which a low-level potential is provided, and the output node discharge portion includes a fifth transistor having a first electrode to which the second clock signal is provided, a second electrode to which the output node is connected, and a third electrode to which a low-level potential is provided.

According to a fifth aspect of the present invention, in the first aspect of the present invention, in each bistable circuit, the second node charge portion includes a sixth transistor having a first electrode to which a state signal outputted from a bistable circuit of a previous stage of the bistable circuit is provided, a second electrode to which a high-level potential is provided, and a third electrode to which the second node is connected.

According to a sixth aspect of the present invention, in the first aspect of the present invention, in each bistable circuit, the second node charge portion includes a seventh transistor having a first electrode and a second electrode to which a state signal outputted from a bistable circuit of a previous stage of the bistable circuit is provided, and a third electrode to which the second node is connected.

According to a seventh aspect of the present invention, in the first aspect of the present invention, the transistors included in each bistable circuit are all n-channel type thin film transistors.

An eighth aspect of the present invention is directed to a scanning signal line drive circuit of a display device that drives a plurality of scanning signal lines arranged in a display unit, the scanning signal line drive circuit comprising a shift register according to any one of the first through the seventh aspects of the present invention, wherein the plurality of bistable circuits are provided so as to have a one-to-one correspondence with the plurality of scanning signal lines, and each bistable circuit provides a state signal outputted from an output node, to its corresponding scanning signal line as a scanning signal.

A ninth aspect of the present invention is directed to a display device including the display unit and comprising a scanning signal line drive circuit according to the eighth aspect of the present invention.

A tenth aspect of the present invention is directed to a method of driving a shift register including a plurality of bistable circuits having a first state and a second state and connected in series with each other, the plurality of bistable circuits being sequentially placed in the first state based on two-phase clock signals including a first and a second clock signal, the first and second clock signals being provided from an external source of each bistable circuit and periodically repeating a high-level potential and a low-level potential, the method comprising:

a first driving step of bringing about a preliminary state for changing each bistable circuit from the second state to the first state;

a second driving step of placing a bistable circuit being in the preliminary state, in the first state; and a third driving step of changing each bistable circuit from the first state to the second state, wherein each bistable circuit includes:

an output node that outputs a state signal indicating either one of the first state and the second state;

a first transistor having a second electrode to which a high-level potential is provided, and a third electrode connected to the output node;

a second transistor having a first electrode to which the first clock signal is provided, a third electrode connected to a first node connected to a first electrode of the first transistor, and a smaller channel area than the first transistor;

a second node charge portion for charging a second node based on a predetermined set signal, the second node being connected to a second electrode of the second transistor;

a second node discharge portion for discharging the second node based on a predetermined reset signal;

a first node discharge portion for discharging the first node based on the second clock signal; and an output node discharge portion for discharging the output node based on the second clock signal, in the first driving step, the second node is charged by the second node charge portion based on the set signal, in the second driving step, the first node is charged by the second transistor being placed in a conducting state based on the first clock signal, and in the third driving step, the second node is discharged by the second node discharge portion based on the reset signal, and the first node is discharged by the first node discharge portion and the output node is discharged by the output node discharge portion, based on the second clock signal.

According to an eleventh aspect of the present invention, in the tenth aspect of the present invention, in each bistable circuit, the second node discharge portion includes a third transistor having a first electrode to which the reset signal is provided, a second electrode to which the second node is connected, and a third electrode to which a low-level potential is provided, the first node discharge portion includes a fourth transistor having a first electrode to which the second clock signal is provided, a second electrode to which the first node is connected, and a third electrode to which a low-level potential is provided, and the output node discharge portion includes a fifth transistor having a first electrode to which the second clock signal is provided, a second electrode to which the output node is connected, and a third electrode to which a low-level potential is provided, and in the third driving step, the third transistor is placed in a conducting state based on the reset signal, and the fourth transistor is placed in a conducting state and the fifth transistor is placed in a conducting state, based on the second clock signal.

According to a twelfth aspect of the present invention, in the tenth aspect of the present invention, the second node charge portion includes a sixth transistor having a first electrode to which the set signal is provided, a second electrode to which a high-level potential is provided, and a third electrode to which the second node is connected, and in the first driving step, the sixth transistor is placed in a conducting state based on the set signal.

According to a thirteenth aspect of the present invention, in the tenth aspect of the present invention, the second node charge portion includes a seventh transistor having a first electrode and a second electrode to which the set signal is provided, and a third electrode to which the second node is connected, and in the first driving step, the seventh transistor is placed in a conducting state based on the set signal.

Effects of the Invention

According to the first aspect of the present invention, a constant high-level potential is provided to the second electrode of the first transistor (typically, the drain electrode of a thin film transistor) which functions as an output transistor. Hence, the first transistor being placed in an on state (conducting state) due to a change in the potential of the second electrode of the first transistor does not occur during periods other than a selected period. In addition, the first electrode of the first transistor is connected to the first node. For the second transistor having the third electrode connected to the first node, a first clock signal is provided to the first electrode and the second electrode is connected to the second node. Here, the second node is charged based on a state signal outputted from a bistable circuit of a previous stage of each bistable circuit, and is discharged based on a state signal outputted from a bistable circuit of a subsequent stage of each bistable circuit. Therefore, the potential of the second node is maintained at a low level during most periods. Hence, an increase in the potential of the first node due to the second transistor being placed in an on state based on the first clock signal does not occur during periods other than the selected period. In other words, the first transistor is not placed in an on state during periods other than the selected period. Accordingly, the occurrence of crosstalk which conventionally occurs due to a change in the potential of a clock signal and overlap capacitance in a transistor is suppressed and thus degradation in the display quality of the display device is suppressed.

According to the second aspect of the present invention, the channel area of the first transistor is made larger than that of the second transistor. Hence, even if overlap capacitance occurs in the second transistor, the influence of a change in the potential of the first clock signal and the overlap capacitance in the second transistor on the first node is relatively small. Accordingly, unlike the conventional example, during periods other than the selected period, the potential of the first node does not increase to a level that places the first transistor in an on state. Accordingly, the occurrence of crosstalk which conventionally occurs due to a change in the potential of a clock signal and overlap capacitance in a transistor is securely prevented and thus degradation in the display quality of the display device is effectively suppressed.

According to the third aspect of the present invention, each bistable circuit is provided with a capacitor connected at its one end to the second node and connected at its other end to the output node. Meanwhile, the second node is charged based on a state signal outputted from a bistable circuit of a previous stage of each bistable circuit. At this time, it is only necessary to charge the capacitor such that the potential of the second node is brought to a high-level potential. Thus, unlike the configuration of the conventional example, there is no need to flow a current through a power supply line via any of the transistors. Accordingly, unlike the conventional example, there is no need to provide transistors having a large channel area. Due to the above, a display device is implemented that is capable of suppressing degradation in display quality caused by crosstalk, without causing an increase in power consumption or an increase in frame size.

According to the fourth aspect of the present invention, in a configuration in which transistors are included in the second node discharge portion, the first node discharge portion, and the output node discharge portion, the same effect as that obtained in the first aspect of the present invention is obtained.

According to the fifth aspect of the present invention, in a configuration in which a transistor is included in the second node charge portion, the same effect as that obtained in the first aspect of the present invention is obtained.

According to the sixth aspect of the present invention, in a configuration in which a diode-connected transistor is included in the second node charge portion, the same effect as that obtained in the first aspect of the present invention is obtained.

According to the seventh aspect of the present invention, comparing with a configuration in which an n-channel type thin film transistor and a p-channel type thin film transistor are mixed, the number of photomasks used in a TFT array substrate fabrication process can be reduced.

According to the eighth aspect of the present invention, a scanning signal line drive circuit is implemented that includes a shift register with which the same effect as that obtained in any of the first to seventh aspects of the present invention is obtained.

According to the ninth aspect of the present invention, a display device is implemented that includes a scanning signal line drive circuit with which the same effect as that obtained in the eighth aspect of the present invention is obtained.

BRIEF DESCRIPTION OF THE DRAWINGS

FIG. 8 is a block diagram showing a configuration of a shift register in a gate driver in a conventional example.

FIG. 13 is a circuit diagram showing a configuration of a bistable circuit included in the shift register in another conventional example.

FIGS. 17 to 17F are diagrams for describing the occurrence of crosstalk in the conventional example.

MODE FOR CARRYING OUT THE INVENTION

One embodiment of the present invention will be described below with reference to the accompanying drawings. Note that in the following description the gate terminal (gate electrode) of a thin film transistor corresponds to a first electrode, the drain terminal (drain electrode) corresponds to a second electrode, and the source terminal (source electrode) corresponds to a third electrode.

<1. Overall Configuration and Operation>

Figure 2:
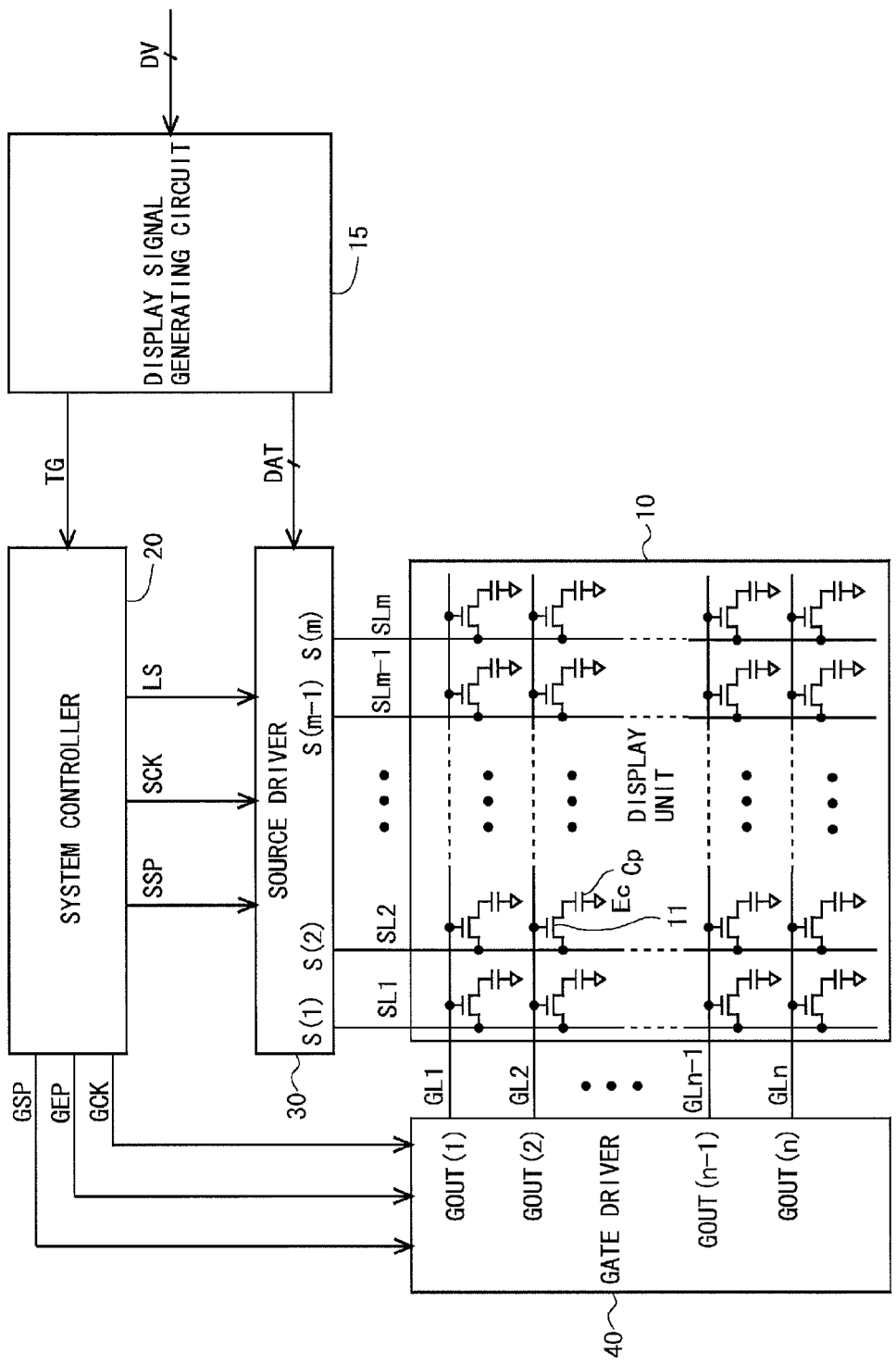
FIG. 2 is a block diagram showing an overall configuration of the liquid crystal display device in the embodiment.

FIG. 2 is a block diagram showing an overall configuration of an active matrix-type liquid crystal display device according to one embodiment of the present invention. As shown in FIG. 2, the liquid crystal display device includes a display unit 10, a display signal generating circuit 15, a system controller 20, a source driver (video signal line drive circuit) 30, and a gate driver (scanning signal line drive circuit) 40.

The display unit 10 includes a plurality of (m) source bus lines (video signal lines) SL1 to SLm; a plurality of (n) gate bus lines (scanning signal lines) GL1 to GLn; and a plurality of (n×m) pixel formation portions provided at the respective intersections of the source bus lines SL1 to SLm and the gate bus lines GL1 to GLn.

The plurality of pixel formation portions are arranged in a matrix form and thereby form a pixel array. Each pixel formation portion is composed of a thin film transistor (TFT) 11 which is a switching element connected at its gate terminal to a gate bus line passing through a corresponding intersection, and connected at its source terminal to a source bus line passing through the intersection; a pixel electrode connected to the drain terminal of the thin film transistor 11; a common electrode Ec which is a counter electrode provided so as to be shared by the plurality of pixel formation portions; and a liquid crystal layer which is provided so as to be shared by the plurality of pixel formation portions and which is sandwiched between the pixel electrode and the common electrode Ec. By a liquid crystal capacitance formed by the pixel electrode and the common electrode Ec, a pixel capacitance Cp is formed. Note that normally, an auxiliary capacitance is provided in parallel with the liquid crystal capacitance in order to securely hold a voltage in the pixel capacitance Cp; however, the auxiliary capacitance is not directly related to the present invention and thus the description and depiction thereof are omitted.

The display signal generating circuit 15 receives a digital video signal DV sent from an external source and extracts luminance grayscale signal components and timing signal components from the digital video signal DV. Then, the display signal generating circuit 15 provides the luminance grayscale signal components to the source driver 30 as display data DAT and provides the timing signal components to the system controller 20 as a timing signal TG.

The system controller 20 generates a source start pulse signal SSP, a source clock signal SCK, a latch strobe signal LS, a gate start pulse signal GSP, a gate end pulse signal GEP, and a gate clock signal GCK which are for controlling image display on the display unit 10, based on the timing signal TG outputted from the display signal generating circuit 15, and outputs the signals.

The source driver 30 receives the display data DAT outputted from the display signal generating circuit 15 and the source start pulse signal SSP, the source clock signal SCK, and the latch strobe signal LS which are outputted from the system controller 20, and applies driving video signals S(1) to S(m) to the source bus lines SL1 to SLm, respectively.

The gate driver 40 repeats application of active scanning signals GOUT(1) to GOUT(n) to the respective gate bus lines GL1 to GLn in cycles of one vertical scanning period, based on the gate start pulse signal GSP, the gate end pulse signal GEP, and the gate clock signal GCK which are outputted from the system controller 20. Note that a detailed description of the gate driver 40 will be made later.

In the above-described manner, the driving video signals S(1) to S(m) are applied to the source bus lines SL1 to SLm, respectively, and the scanning signals GOUT(1) to GOUT(n) are applied to the gate bus lines GL1 to GLn, respectively, whereby an image based on the digital video signal DV sent from the external source is displayed on the display unit 10.

<2. Configuration and Operation of the Gate Driver>

Figure 3:
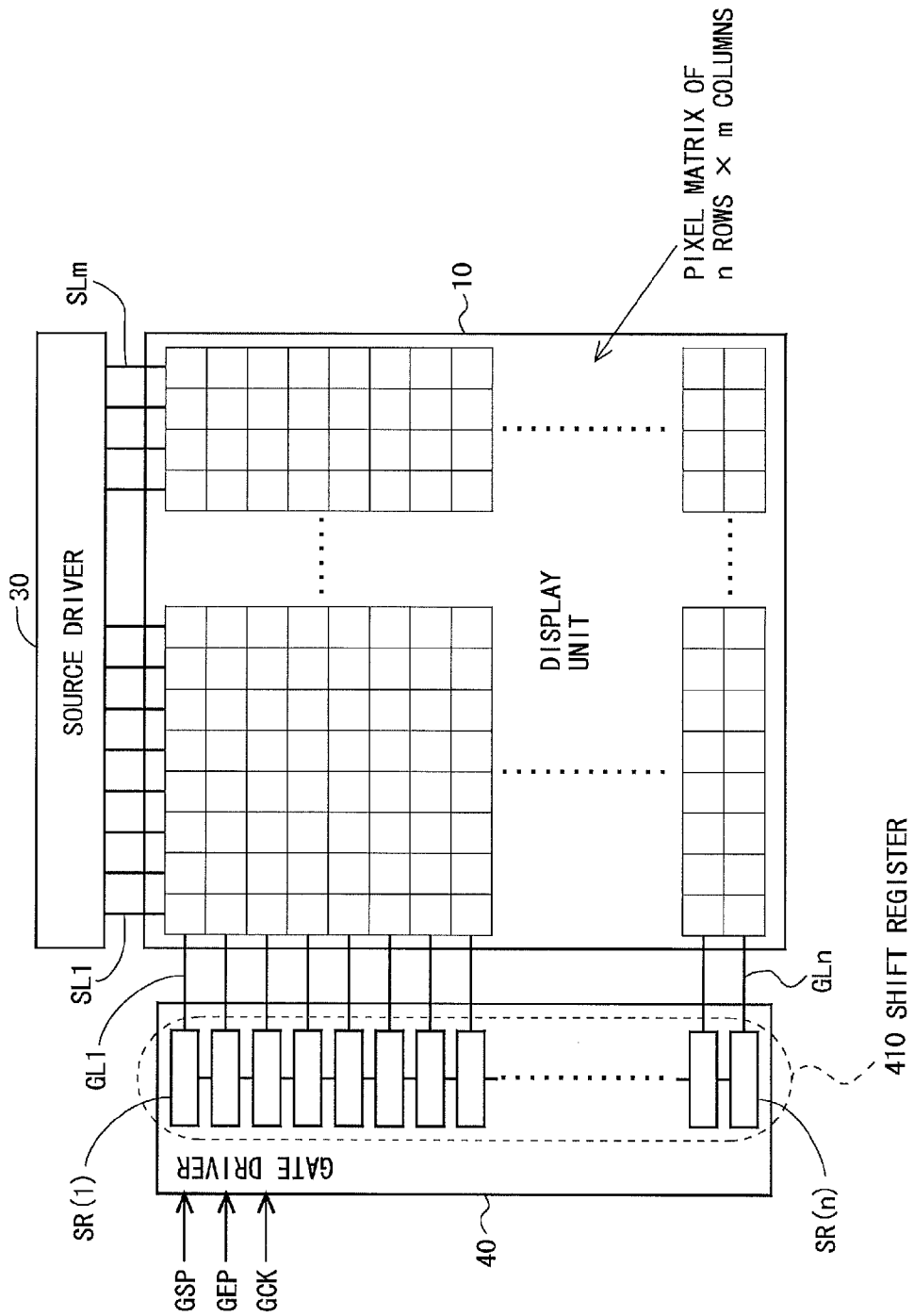
FIG. 3 is a block diagram for describing a configuration of the gate driver in the embodiment.

Next, with reference to FIGS. 3, 4, and 5(A) to 5(H), an overview of the configuration and operation of the gate driver 40 of the present embodiment will be described. As shown in FIG. 3, the gate driver 40 is composed of an n-stage shift register 410. In the display unit 10, a pixel matrix of n rows×m columns is formed, and the stages of the shift register 410 are provided so as to have a one-to-one correspondence with the rows of the pixel matrix. In addition, each stage of the shift register 410 is a bistable circuit which is in either one of two states (a first state and a second state) at each time point and which outputs a signal (state signal) indicating the state, as a scanning signal. As such, the shift register 410 is composed of n bistable circuits SR(1) to SR(n). Note that, in the present embodiment, when a bistable circuit is in the first state, a gate bus line connected to the bistable circuit is placed in a selected state, and when a bistable circuit is in the second state, a gate bus line connected to the bistable circuit is placed in a non-selected state.

Figure 4:
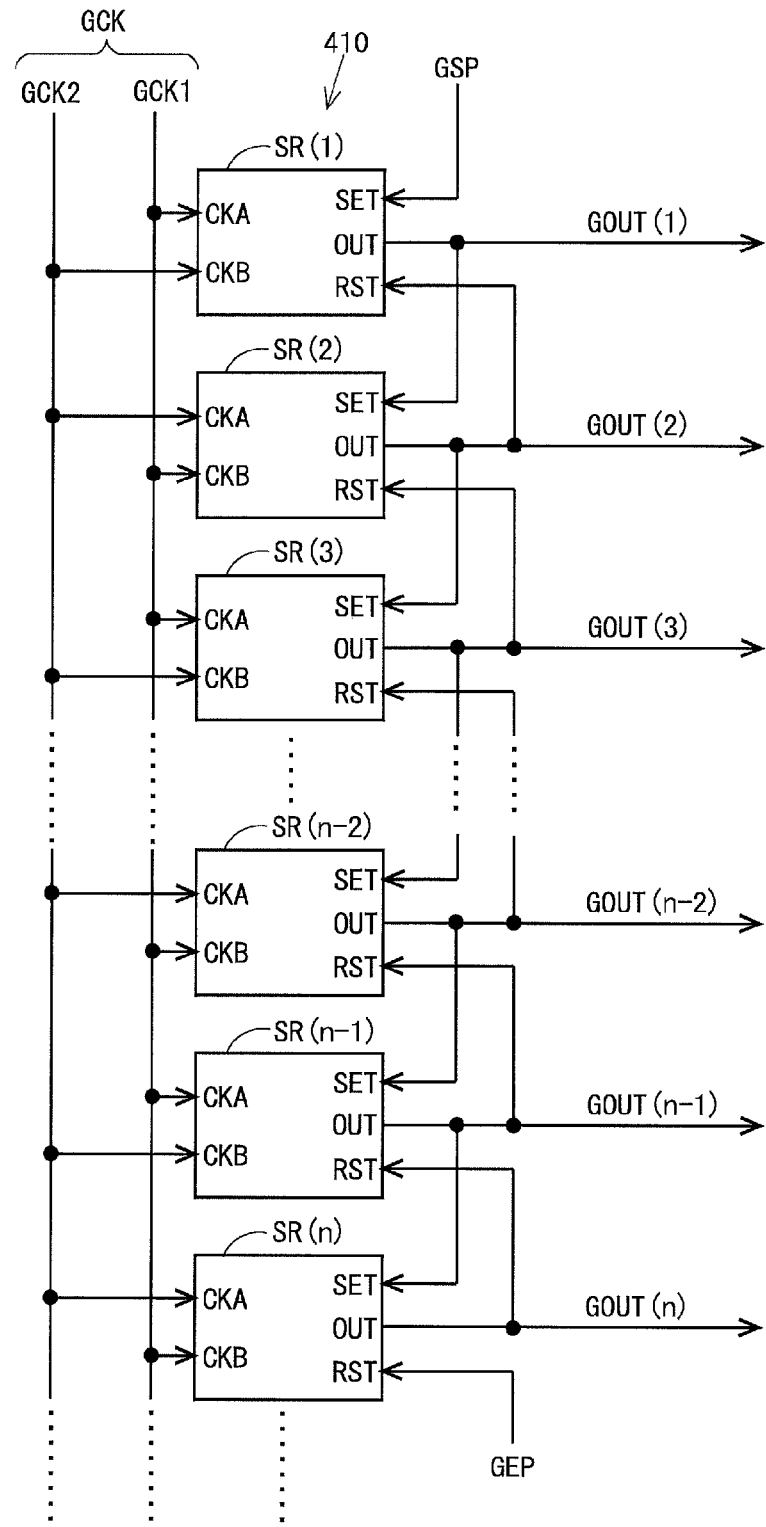
FIG. 4 is a block diagram showing a configuration of the shift register in the gate driver in the embodiment.

FIG. 4 is a block diagram showing a configuration of the shift register 410 in the gate driver 40. As described above, the shift register 410 is composed of the n bistable circuits SR(1) to SR(n). As shown in FIG. 4, to the shift register 410 are provided two-phase gate clock signals GCK1 (hereinafter, referred to as a "first gate clock signal") and GCK2 (hereinafter, referred to as a "second gate clock signal"), a gate start pulse signal GSP which is a signal for starting scanning of the gate bus lines, and a gate end pulse signal GEP which is a signal for terminating the scanning of the gate bus lines. Each bistable circuit is provided with an input terminal for receiving either one of the first gate clock signal GCK1 and the second gate clock signal GCK2 as a first clock CKA; an input terminal for receiving the other one of the first gate clock signal GCK1 and the second gate clock signal GCK2 as a second clock CKB; an input terminal for receiving the gate start pulse signal GSP or a state signal OUT outputted from its previous stage, as a set signal SET; an input terminal for receiving the gate end pulse signal GEP or a state signal OUT outputted from its subsequent stage, as a reset signal RST; and an output terminal for outputting a state signal OUT as a scanning signal GOUT. Note that the first gate clock signal GCK1 and the second gate clock signal GCK2 are shifted in phase from each other by 180 degrees.

In the present embodiment, signals provided to the input terminals of each stage (each bistable circuit) are as follows. For the bistable circuit SR(1) of the first stage, a first gate clock signal GCK1 is provided as a first clock CKA, a second gate clock signal GCK2 is provided as a second clock CKB, a gate start pulse signal GSP is provided as a set signal SET, and a state signal OUT from its subsequent stage is provided as a reset signal RST. For the bistable circuit SR (2) of the second stage, the second gate clock signal GCK2 is provided as a first clock CKA, the first gate clock signal GCK1 is provided as a second clock CKB, a state signal OUT from its previous stage is provided as a set signal SET, and a state signal OUT from its subsequent stage is provided as a reset signal RST. For the bistable circuit SR (3) of the third stage, the first gate clock signal GCK1 is provided as a first clock CKA, the second gate clock signal GCK2 is provided as a second clock CKB, the state signal OUT from its previous stage is provided as a set signal SET, and a state signal OUT from its subsequent stage is provided as a reset signal RST. For the bistable circuits SR (4) to SR (n−1) of the fourth to (n−1) th stages, the same configurations as the above-described configurations of the second and third stages are repeated every two stages. For the bistable circuit SR(n) of the nth stage, the second gate clock signal GCK2 is provided as a first clock CKA, the first gate clock signal GCK1 is provided as a second clock CKB, a state signal OUT from its previous stage is provided as a set signal SET, and a gate end pulse signal GEP is provided as a reset signal RST.

Next, a signal outputted from the output terminal of each stage (each bistable circuit) will be described. A state signal OUT outputted from the bistable circuit SR (1) of the first stage serves as a scanning signal GOUT (1) for placing the gate bus line GL1 of the first row in a selected state, and is provided to the bistable circuit SR (2) of the second stage as a set signal SET. A state signal OUT outputted from the bistable circuit SR(n) of the nth stage serves as a scanning signal GOUT (n) for placing the gate bus line GLn of the nth row in a selected state, and is provided to the bistable circuit SR (n−1) of the (n−1)th stage as a reset signal RST. State signals OUT outputted from other stages serve as scanning signals for placing gate bus lines of their corresponding rows in a selected state, and are provided to their respective subsequent stages as set signals SET and provided to their respective previous stages as reset signals RST.

Figure 5:
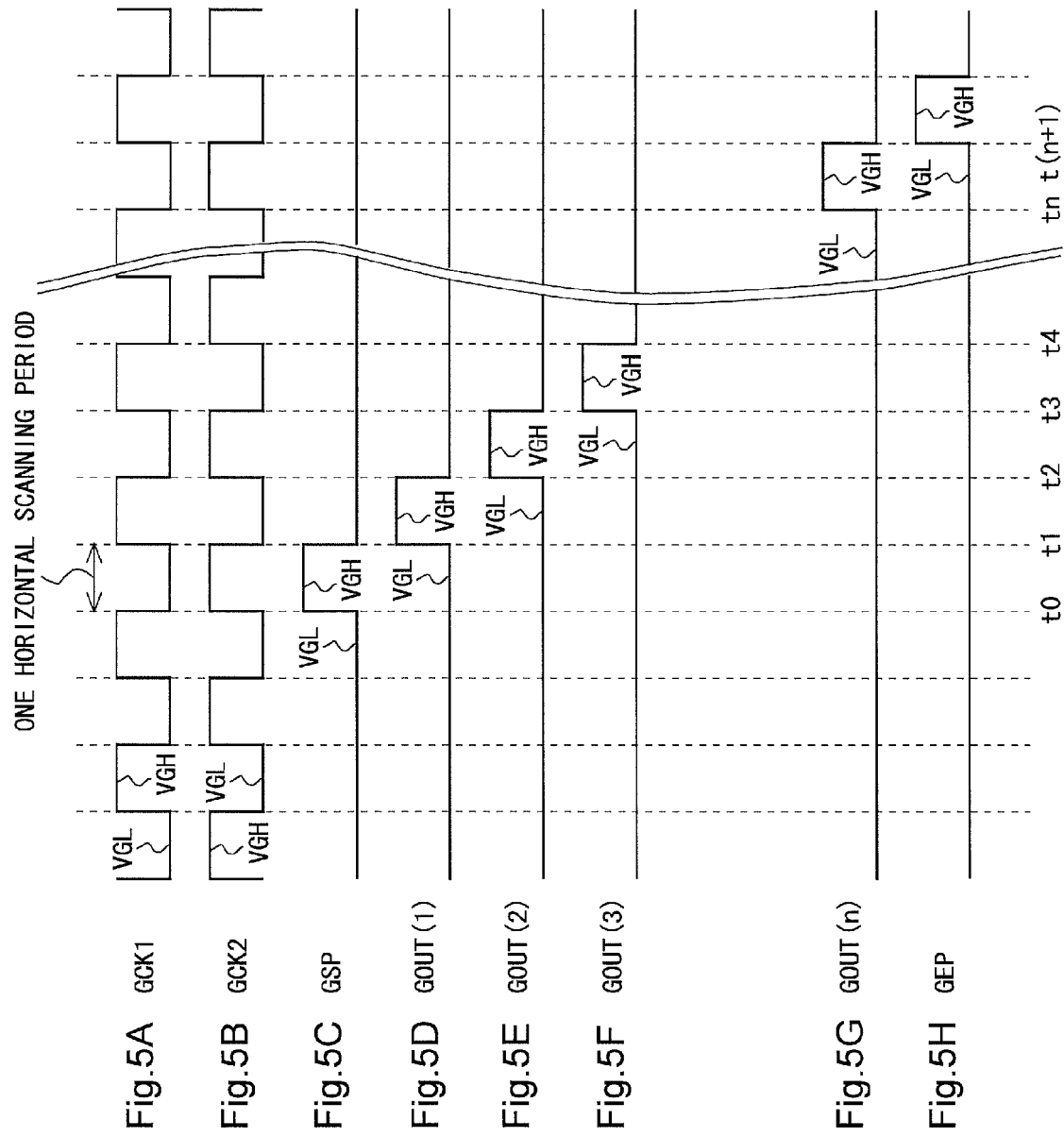
FIGS. 5A to 5H are timing charts of input and output signals to/from the shift register in the embodiment.

FIGS. 5A to 5H are timing charts of input and output signals to/from the shift register 410 in the present embodiment. During the operation of the liquid crystal display device, as shown in FIGS. 5A and 5B, a first gate clock signal GCK1 and a second gate clock signal GCK2 which are shifted in phase from each other by 180 degrees are provided to the shift register 410 in the gate driver 40. When reaching time point t1, a pulse of a gate start pulse signal GSP (see FIG. 5C) is provided to the bistable circuit SR(1) of the first stage in the shift register 410. Based on the pulse, the bistable circuit SR(1) of the first stage operates in a manner described later, and at time point t1, a state signal outputted from the bistable circuit SR(1) of the first stage goes to a high level. For the second and subsequent stages, based on state signals outputted from the previous stages of the respective stages, state signals outputted from the respective stages go to a high level. Accordingly, as shown in FIGS. 5D to 5G, state signals which sequentially go to a high level for one horizontal scanning period are provided to the gate bus lines GL1 to GLn in the display unit 10, as scanning signals GOUT(1) to GOUT(n). When reaching time point t(n+1) after a state signal outputted from the bistable circuit SR(n) of the nth stage goes to a high level at time point tn, a pulse of a gate end pulse signal GEP (see FIG. 5H) is provided to the bistable circuit SR(n) of the nth stage in the shift register 410. Accordingly, the operation for performing image display for one frame is completed.

<3. Configuration of the Bistable Circuits>

Figure 1:
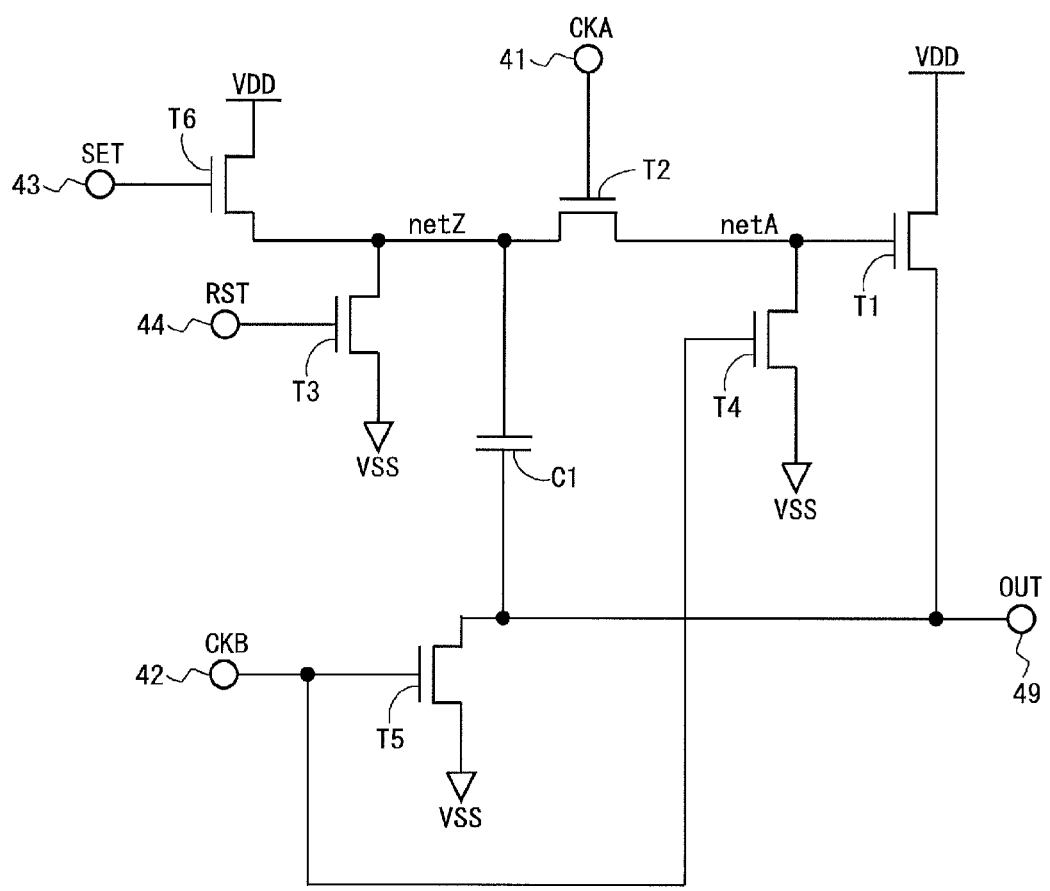
FIG. 1 is a circuit diagram showing a configuration of a bistable circuit included in a shift register in a gate driver of an active matrix-type liquid crystal display device according to one embodiment of the present invention.

FIG. 1 is a circuit diagram showing a configuration of a bistable circuit included in the above-described shift register 410 (a configuration for one stage of the shift register 410). As shown in FIG. 1, the bistable circuit includes six thin film transistors (here, n-type TFTs) T1 to T6 (first to sixth transistors) and a capacitor C1. The thin film transistors T1 to T6 are not particularly limited but, for example, amorphous silicon TFTs, low-temperature polysilicon TFTs, CG (Continuous Grain) silicon TFTs, etc., are employed. In addition, the bistable circuit has input terminals for a power supply line VDD which supplies a relatively high-level potential VGH and input terminals for a power supply line VSS which supplies a relatively low-level potential VGL, and four input terminals 41 to 44 and one output terminal (output node) 49. The potential VGH corresponds to a potential that places a thin film transistor 11 in a pixel formation portion in the display unit 10 in an on state, and the potential VGL corresponds to a potential that places the thin film transistor 11 in an off state. Note that the input terminal that receives a first clock CKA is denoted by a reference numeral 41, the input terminal that receives a second clock CKB is denoted by a reference numeral 42, the input terminal that receives a set signal SET is denoted by a reference numeral 43, and the input terminal that receives a reset signal RST is denoted by a reference numeral 44. A connection relationship between the components in the bistable circuit will be described below.

The gate terminal of the thin film transistor T1, the source terminal of the thin film transistor T2, and the drain terminal of the thin film transistor T4 are connected to one another. Note that a region (wiring line) where they are connected to one another is referred to as a "netA" (first node) for convenience's sake. The drain terminal of the thin film transistor T2, the drain terminal of the thin film transistor T3, the source terminal of the thin film transistor T6, and one end of the capacitor C1 are connected to one another. Note that a region (wiring line) where they are connected to one another is referred to as a "netZ" (second node) for convenience's sake.

The thin film transistor T1 is connected at its gate terminal to the netA, connected at its drain terminal to the power supply line VDD, and connected at its source terminal to the output terminal 49. The thin film transistor T2 is connected at its gate terminal to the input terminal 41, connected at its drain terminal to the netZ, and connected at its source terminal to the netA. The thin film transistor T3 is connected at its gate terminal to the input terminal 44, connected at its drain terminal to the netZ, and connected at its source terminal to the power supply line VSS. The thin film transistor T4 is connected at its gate terminal to the input terminal 42, connected at its drain terminal to the netA, and connected at its source terminal to the power supply line VSS. The thin film transistor T5 is connected at its gate terminal to the input terminal 42, connected at its drain terminal to the output terminal 49, and connected at its source terminal to the power supply line VSS. The thin film transistor T6 is connected at its gate terminal to the input terminal 43, connected at its drain terminal to the power supply line VDD, and connected at its source terminal to the netZ. The capacitor C1 is connected at its one end to the netZ and connected at its other end to the output terminal 49.

Meanwhile, in the present embodiment, the configuration is such that the channel area of the thin film transistor T1 is larger than that of the thin film transistor T2. Specifically, when the channel width of the thin film transistor T1 is W1, the channel length of the thin film transistor T1 is L1, the channel width of the thin film transistor T2 is W2, and the channel length of the thin film transistor T2 is L2, the following equation (1) is established:

$$W1 \times L1 > W2 \times L2 \qquad (1).$$

Note that in the present embodiment a second node discharge portion is implemented by the thin film transistor T3, a first node discharge portion is implemented by the thin film transistor T4, and an output node discharge portion is implemented by the thin film transistor T5.

<4. Operation of the Shift Register>

Next, with reference to FIGS. 1 and 6A to 6G, the operation of each stage (bistable circuit) of the shift register 410 in the present embodiment will be described. Note that FIGS. 6A to 6G show waveforms for the bistable circuit SR (1) of the first stage, and for the bistable circuits SR (2) to SR (n) of the second and subsequent stages, the same waveforms as those shown in FIGS. 6A to 6G appear delayed by one horizontal scanning period. In other words, the n bistable circuits SR (1) to SR (n) perform the same operation with the exception of timing. Accordingly, in the following, description will be made focusing only on the bistable circuit SR (1) of the first stage.

Figure 6:
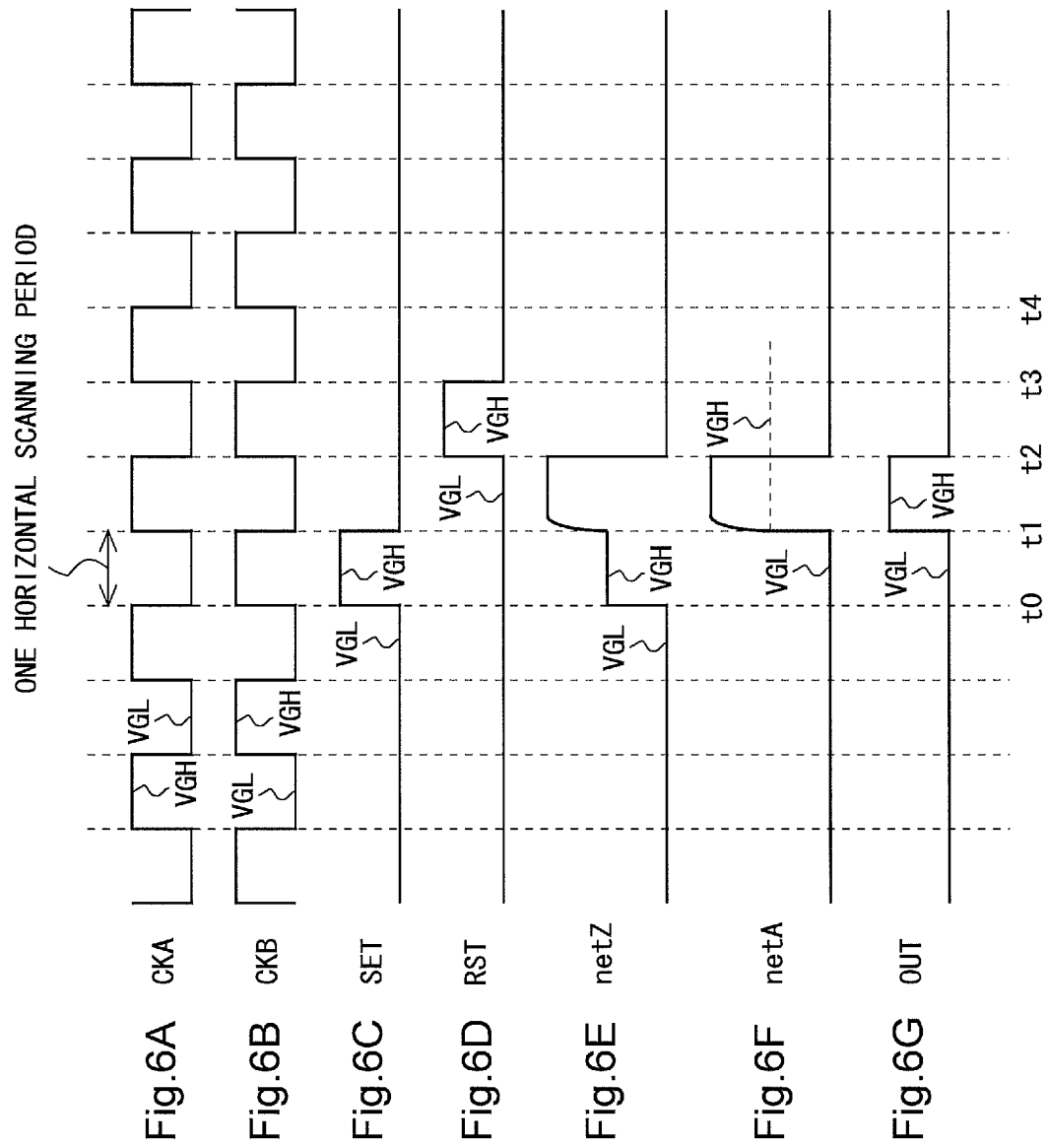
FIGS. 6A to 6G are timing charts for describing the operation of each stage (bistable circuit) of the shift register in the embodiment.

During the operation of the display device, a first clock CKA having a waveform shown in FIG. 6A is provided to the input terminal 41, and a second clock CKB having a waveform shown in FIG. 6B is provided to the input terminal 42. During periods before time point to, as shown in FIGS. 6C to 6G, the potentials of a set signal SET, a reset signal RST, a netZ, a netA, and a state signal OUT are all VGL.

When reaching time point t0, a pulse of the set signal SET is provided to the input terminal 43. Accordingly, the thin film transistor T6 is placed in an on state. By the thin film transistor T6 being placed in an on state, the potential of the netZ increases to the potential VGH of the power supply line VDD. In addition, at time point t0, the potential of the second clock CKB changes from VGL to VGH. Accordingly, the thin film transistors T4 and T5 are placed in an on state. By the thin film transistor T4 being placed in an on state, the potential of the netA is maintained at VGL. In addition, by the thin film transistor T5 being placed in an on state, the potential at the output terminal 49, i.e., the potential of the state signal OUT, is maintained at VGL. Due to the above, the voltage between the two terminals of the capacitor C1 is "VGH-VGL".

When reaching time point t1, the potential of the set signal SET changes from VGH to VGL. Accordingly, the thin film transistor T6 is placed in an off state. In addition, at time point t1, the potential of the second clock CKB changes from VGH to VGL. Accordingly, the thin film transistors T4 and T5 are placed in an off state. Furthermore, at time point t1, the potential of the first clock CKA changes from VGL to VGH. Accordingly, the thin film transistor T2 is placed in an on state. Since the potential of the netZ is VGH at the time point immediately before time point t1, by the thin film transistor T2 being placed in an on state, the potential of the netA increases to VGH. Accordingly, the thin film transistor T1 is placed in an on state. As a result, the potential of the state signal OUT increases to the potential VGH of the power supply line VDD. Accordingly, a gate bus line connected to the output terminal 49 of the bistable circuit is placed in a selected state.

Here, since one end of the capacitor C1 is connected to the netZ and the other end is connected to the output terminal 49, the potential of the netZ also increases with the increase in potential at the output terminal 49. In addition, since, as described above, the thin film transistor T2 is in an on state, the potential of the netA also increases with the increase in the potential of the netZ. Accordingly, during the period from t1 to t2, the potential of the netZ and the potential of the netA increase to "2×VGH".

When reaching time point t2, the potential of the first clock CKA changes from VGH to VGL. Accordingly, the thin film transistor T2 is placed in an off state. In addition, at time point t2, the potential of the second clock CKB changes from VGL to VGH. Accordingly, the thin film transistors T4 and T5 are placed in an on state. By the thin film transistor T2 being placed in an off state and the thin film transistor T4 being placed in an on state, the potential of the netA decreases to VGL. Accordingly, the thin film transistor T1 is placed in an off state. In addition, by the thin film transistor T5 being placed in an on state, the potential of the state signal OUT decreases to VGL. Accordingly, the gate bus line connected to the output terminal 49 of the bistable circuit is placed in a non-selected state. Furthermore, at time point t2, a pulse of a state signal OUT outputted from a bistable circuit of a subsequent stage of the bistable circuit is provided to the input terminal 44 of the bistable circuit as a pulse of the reset signal RST. Accordingly, the thin film transistor T3 is placed in an on state and thus the potential of the netZ decreases to VGL.

When reaching time point t3, the potential of the first clock CKA changes from VGL to VGH. Accordingly, the thin film transistor T2 is placed in an on state. In addition, at time point t3, the potential of the reset signal RST changes from VGH to VGL. Accordingly, the thin film transistor T3 is placed in an off state. Here, the potential of the set signal SET is maintained at VGL at and after time point t1. Hence, at and after time point t1, the thin film transistor T6 is in an off state. The potential of the state signal OUT is maintained at VGL at and after time point t2. Due to the above, for the netZ, the potential VGL immediately before time point t3 is maintained even at and after time point t3. Therefore, even if the thin film transistor T2 is placed in an on state, the potential of the netA is maintained at VGL even at and after time point t3. As a result, at and after time point t3, the thin film transistor T1 is maintained in an off state and the potential of the state signal OUT is also maintained at VGL. For the netZ, the potential VGL at time point t3 is maintained during periods before reaching time point t0 of the next frame period. For the netA and the state signal, the potential VGL at time point t3 is maintained during periods before reaching time point t1 of the next frame period.

The operation such as that described above is sequentially performed at the above-described n bistable circuits SR(1) to SR(n) such that the timing is delayed by one horizontal scanning period. Accordingly, in each frame period, the n gate bus lines GL1 to GLn are sequentially placed in a selected state for one horizontal scanning period.

Note that in the present embodiment a first driving step is implemented by the operation at time point t0, a second driving step is implemented by the operation at time point t1, and a third driving step is implemented by the operation at time point t2. Note also that a state in which the potential of the netA is VGL and the potential of the netZ is VGH, such as that during the period from t0 to t1, corresponds to a preliminary state.

<5. Effects>

Figure 9:
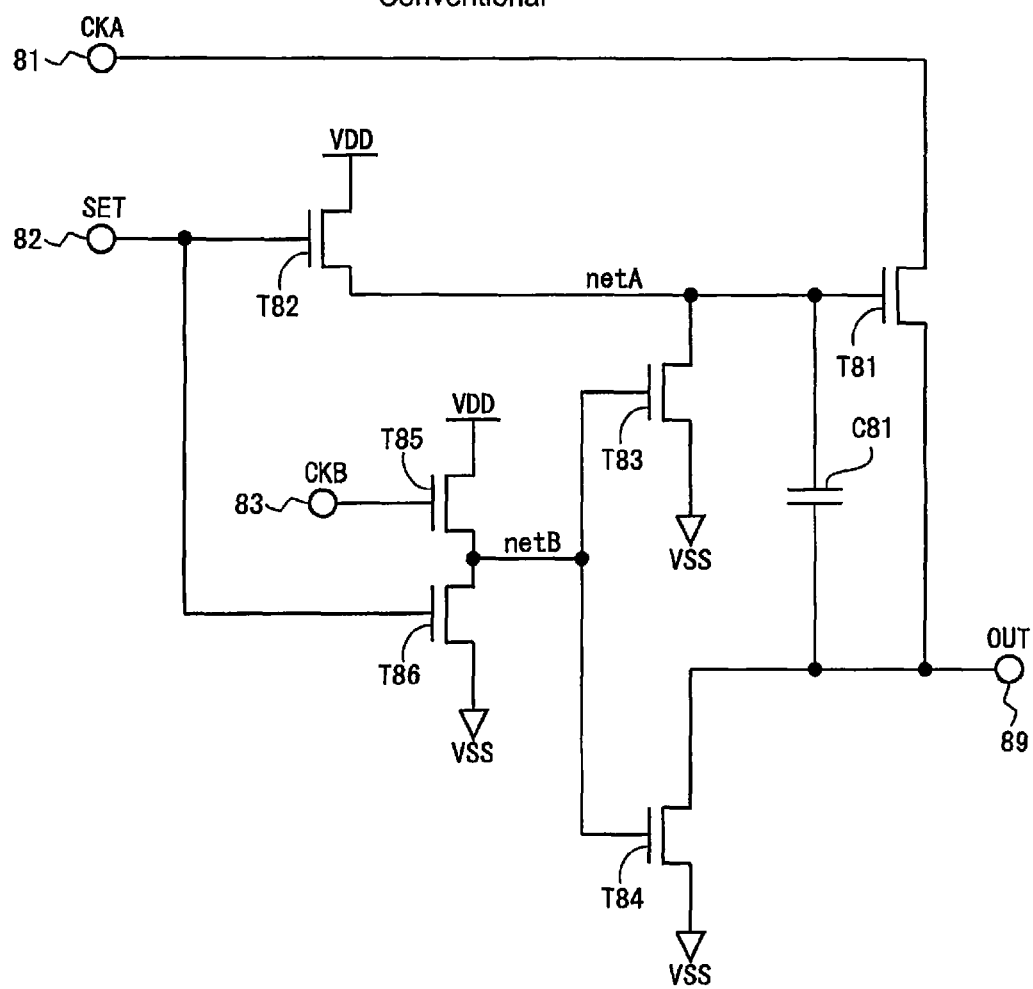
FIG. 9 is a circuit diagram showing a configuration of a bistable circuit included in the shift register in the conventional example.
Figure 10:
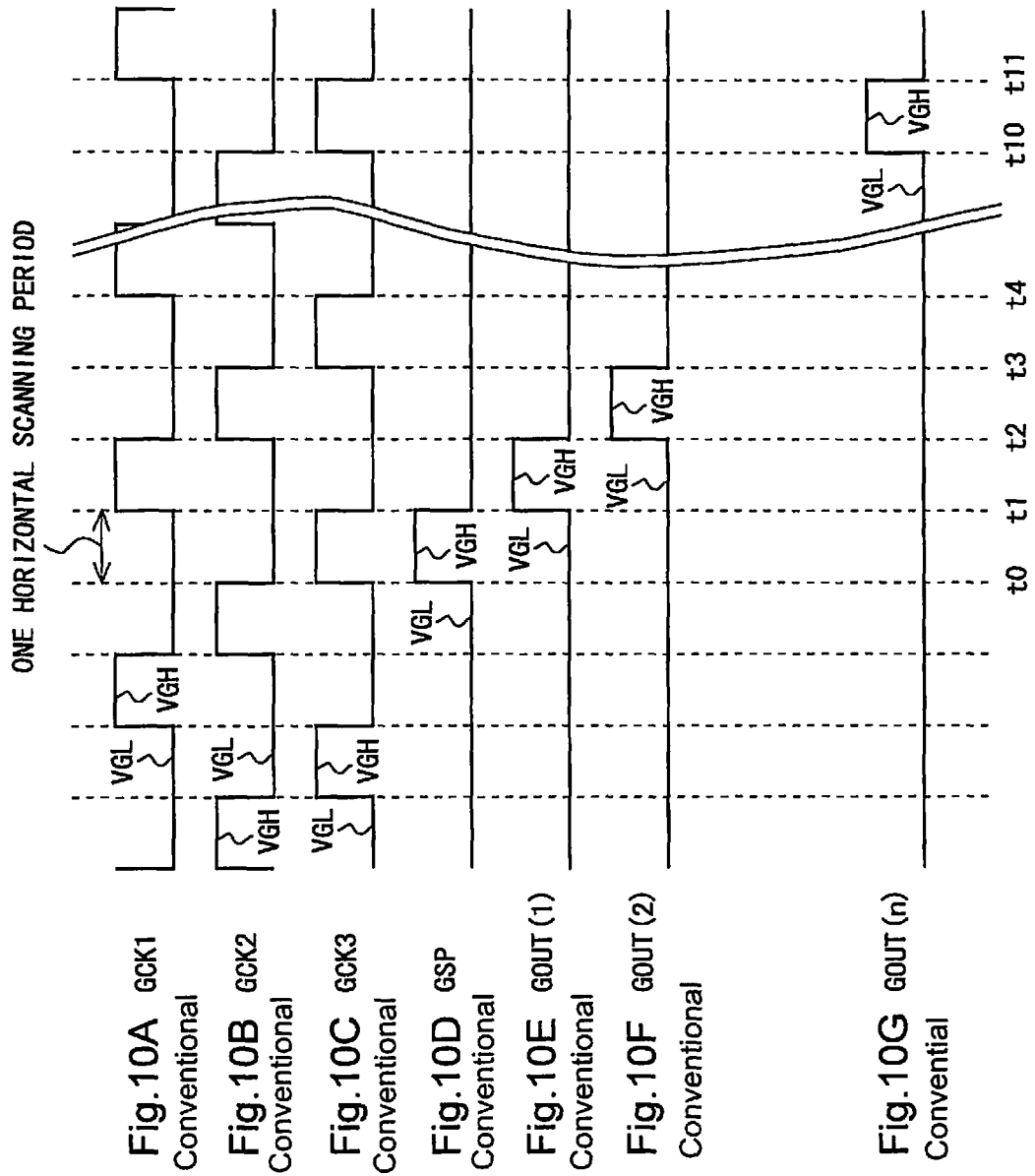
FIGS. 10A to 10G are timing charts of input and output signals to/from the shift register in the conventional example.
Figure 11:
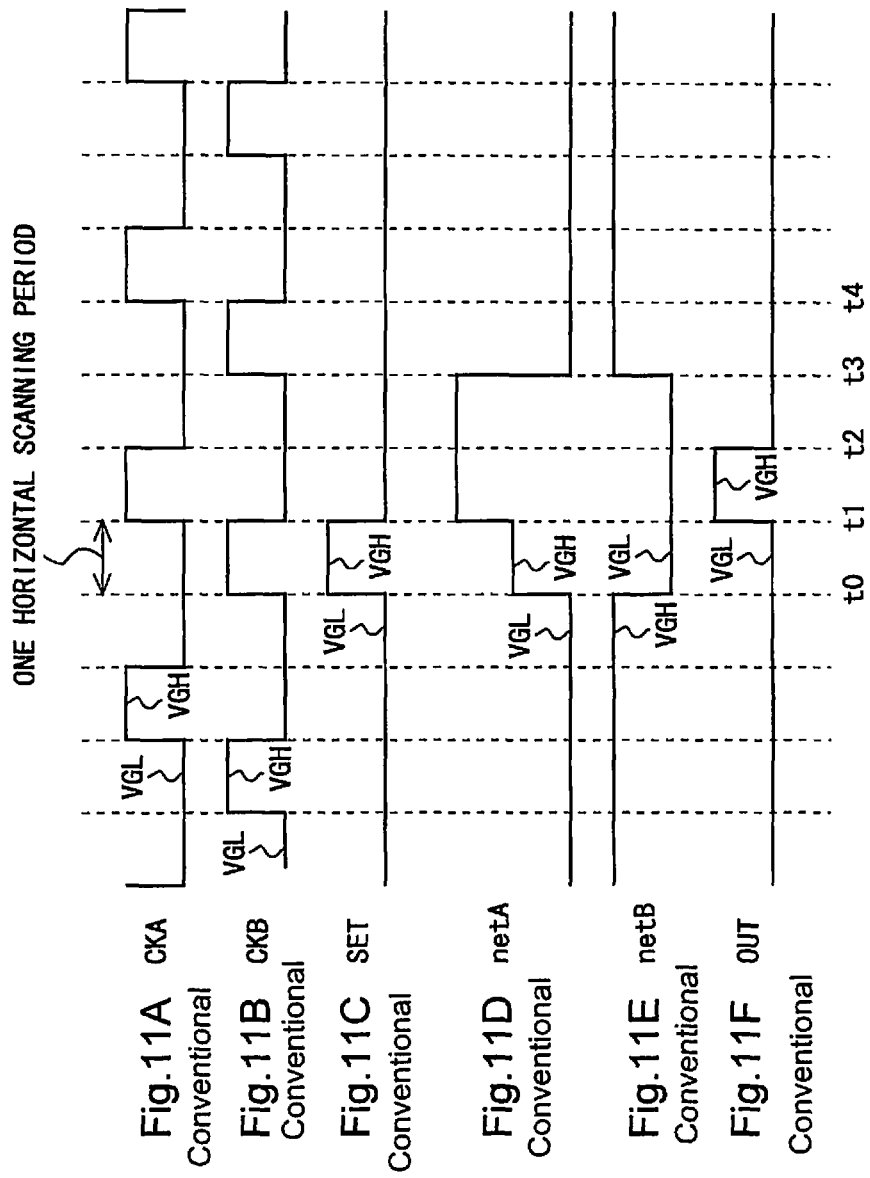
FIGS. 11A to 11F are timing charts for describing the operation of each stage (bistable circuit) of the shift register in the conventional example.
Figure 12:
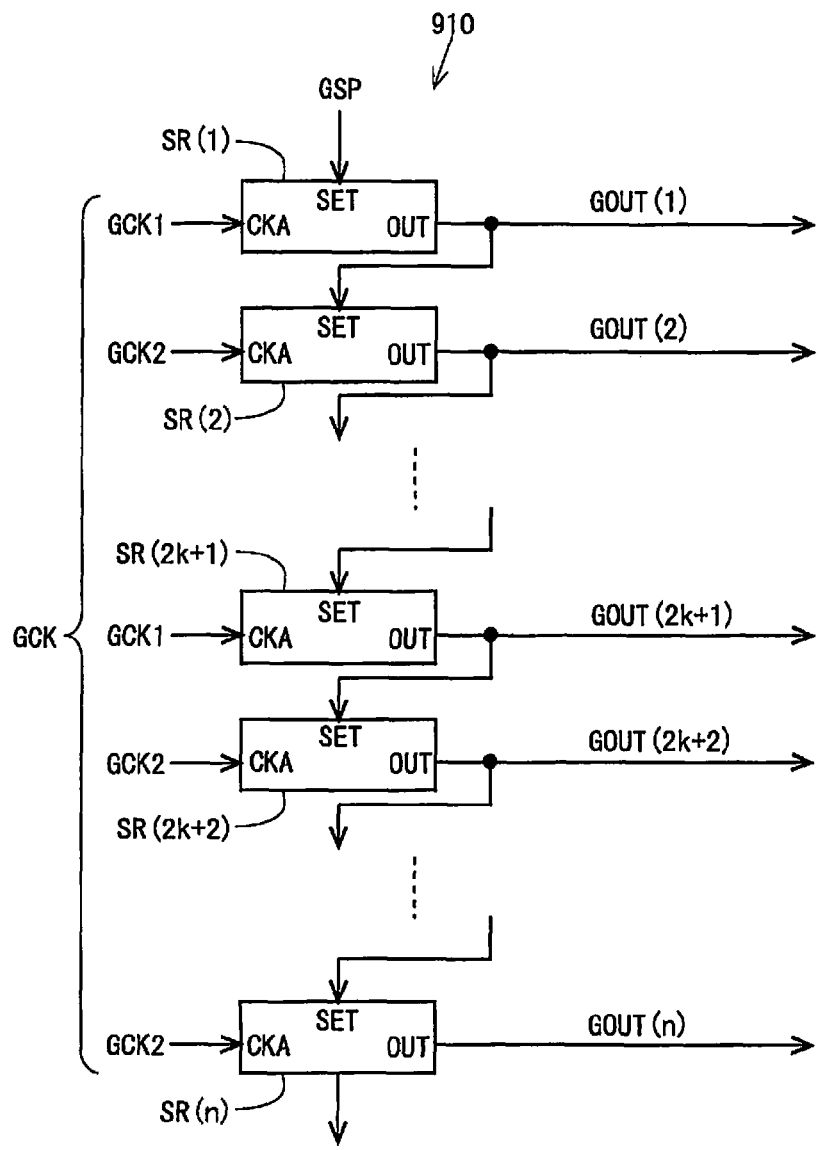
FIG. 12 is a block diagram showing a configuration of a shift register in a gate driver in another conventional example.
Figure 14:
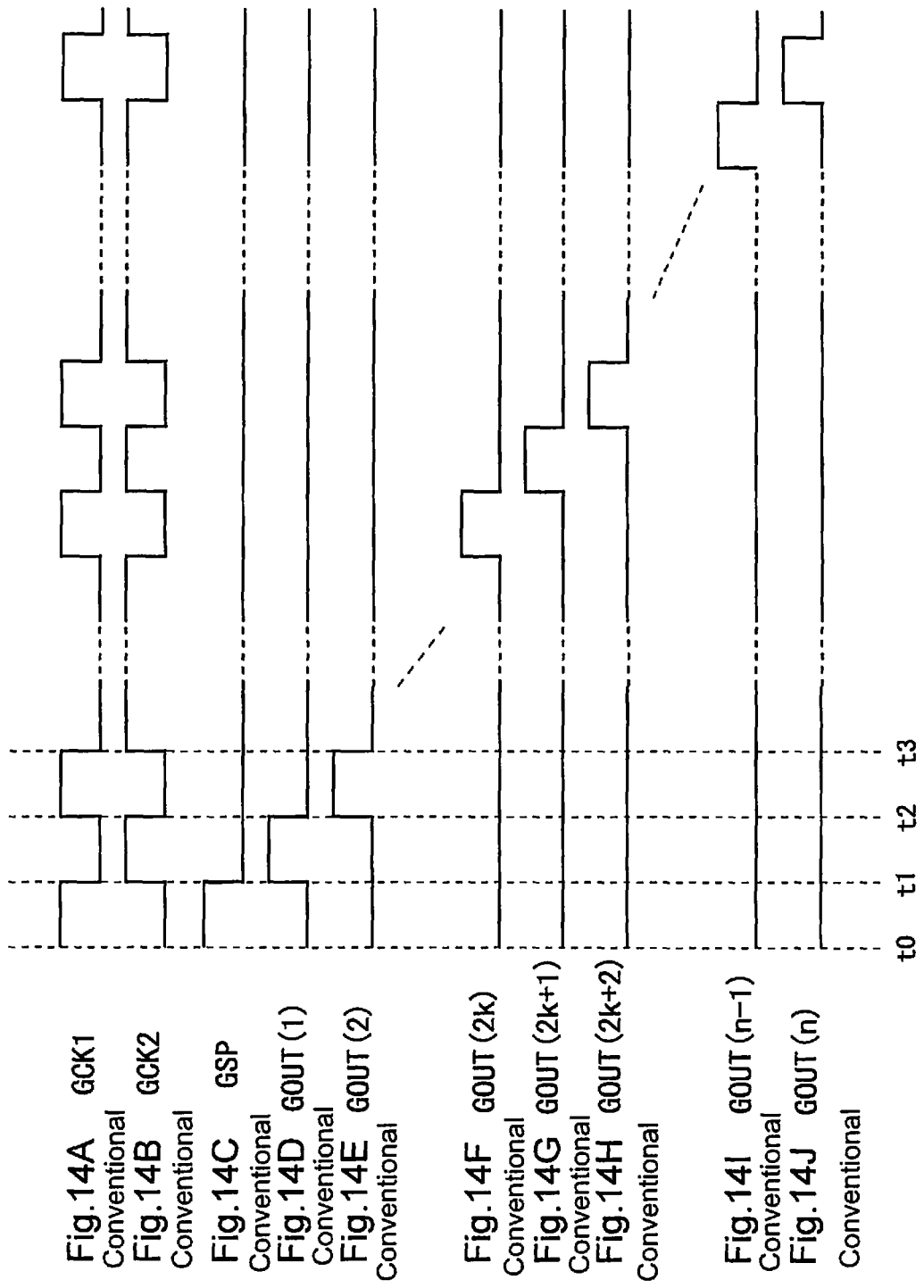
FIGS. 14A to 14J are timing charts of input and output signals to/from the shift register in another conventional example.
Figure 15:
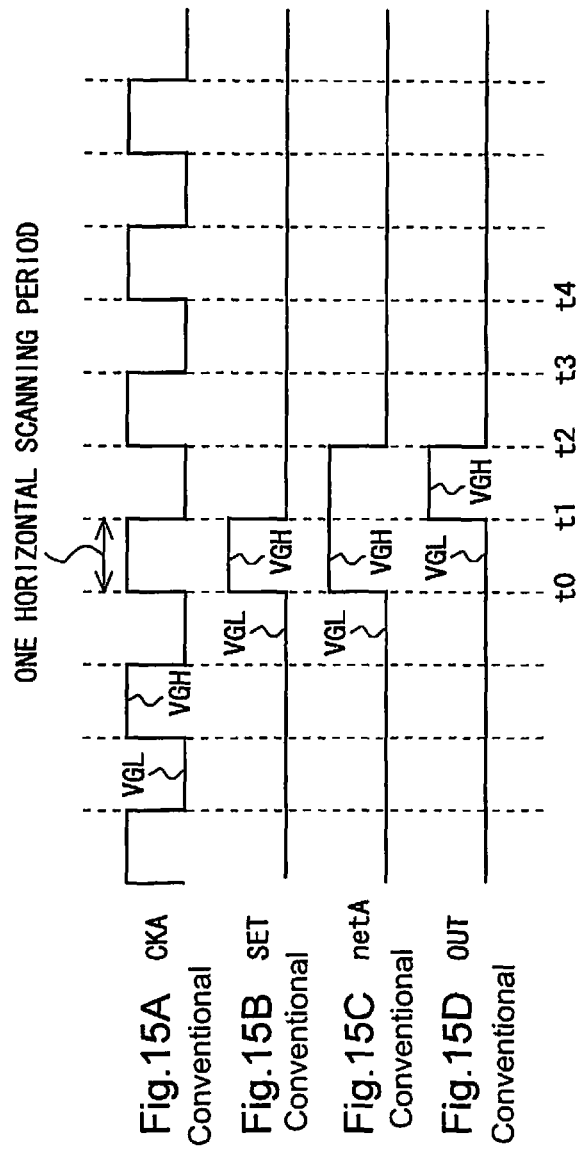
FIGS. 15A to 15D are timing charts for describing the operation of each stage (bistable circuit) of the shift register in another conventional example.
Figure 16:
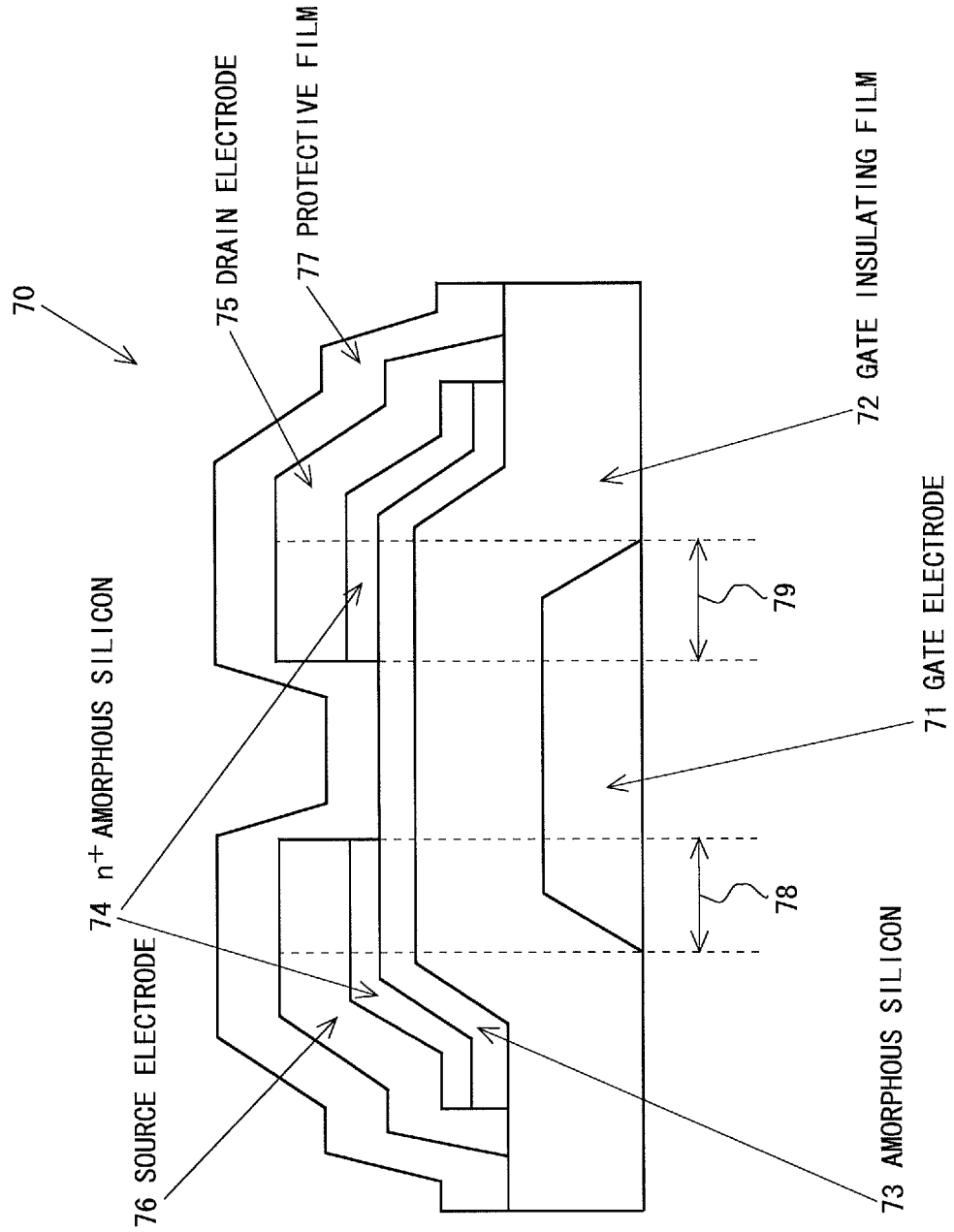
FIG. 16 is a cross-sectional view of a general amorphous silicon TFT.

According to the present embodiment, unlike the configuration of the conventional example shown in FIG. 9, a constant potential VGH is provided to the drain terminal of the thin film transistor T1. Hence, the thin film transistor T1 being placed in an on state due to a change in the potential of the drain terminal of the thin film transistor T1 does not occur during periods other than a selected period (the period from t1 to t2). In addition, since, as shown in FIG. 6E, the potential of the netZ is maintained at VGL during most periods (periods other than the period from t0 to t2), the thin film transistor T1 being placed in an on state due to the thin film transistor T2 being placed in an on state based on the first clock CKA does not occur during periods other than the selected period. Note, however, that taking into account an overlap capacitance Cgs in the thin film transistor T2, the potential of the netA is considered to increase based on a change in the potential of the first clock CKA. In this regard, the present embodiment employs a configuration in which the channel area of the thin film transistor T1 is larger than that of the thin film transistor T2. Hence, the influence of the change in the potential of the first clock CKA and the overlap capacitance Cgs in the thin film transistor T2 on the potential of the netA is relatively small. Accordingly, unlike the conventional example, an increase in the potential of the netA to a level that places the thin film transistor T1 which is an output transistor in an on state does not occur during periods other than the selected period.

As described above, the thin film transistor T1 which is an output transistor is not placed in an on state during periods other than the selected period. In other words, according to the present embodiment, the occurrence of crosstalk which conventionally occurs due to a change in the potential of a clock signal and overlap capacitance in a thin film transistor is prevented and thus degradation in the display quality of the display device is suppressed.

In addition, in the present embodiment, by the set signal SET going to a high level (VGH), the thin film transistor T6 is placed in an on state and accordingly a current from the power supply line VDD flows from the drain terminal to source terminal of the thin film transistor T6. At this time, it is only necessary to charge the capacitor C1 such that the potential of the netZ is brought to VGH by the above-described current. Thus, unlike the configuration of the conventional example shown in FIG. 13, there is no need to flow the above-described current through a power supply line VSS via any of the thin film transistors. Hence, an increase in power consumption such as in the conventional example does not occur. In addition, since there is no need to provide thin film transistors having a relatively large channel area (the thin film transistors T92 and T95 in the example shown in FIG. 13), a frame region for mounting a gate driver does not need to be increased in size.

As described above, according to the present embodiment, a display device is implemented that is capable of suppressing degradation in display quality caused by crosstalk, without causing an increase in power consumption or an increase in frame size.

<6. Variants, etc.>

Although, in the above-described embodiment, description is made using a liquid crystal display device as an example, the present invention is not limited thereto. As long as the configuration includes a shift register, the present invention can also be applied to display devices other than liquid crystal display devices, such as display devices having arranged therein self-light emitting type light-emitting devices such as organic EL (Electro Luminescence) devices or Light-Emitting Diodes (LEDs).

In addition, although, in the above-described embodiment, description is made using an example in which TFTs (Thin Film Transistors) which are MOS transistors (here, MOS transistors including also a silicon gate MOS structure are referred to as MOS transistors) formed on an insulating substrate such as a glass substrate are used as transistors, the present invention is not limited thereto. The present invention can be applied to any drive element as long as the drive element is of a voltage-controlled type in which an output current is controlled by a control voltage applied to a current control terminal and the control voltage has a threshold voltage that determines whether there is an output current.

Figure 7:
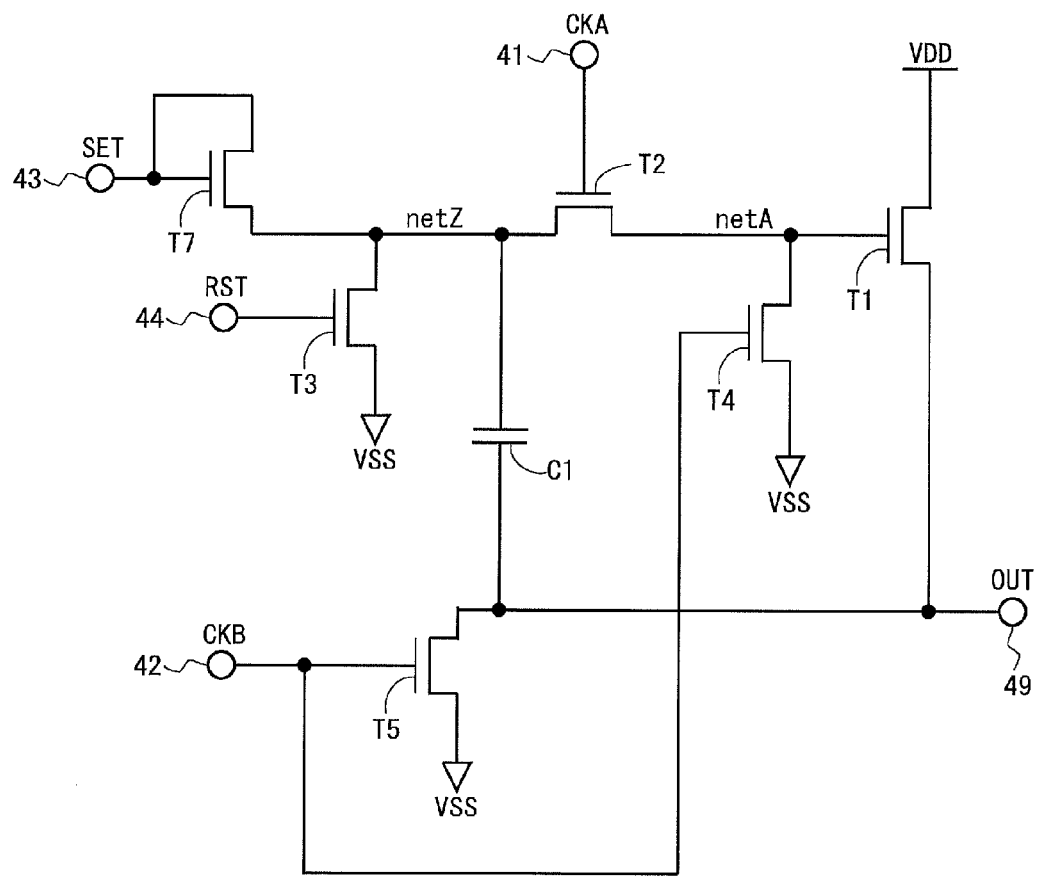
FIG. 7 is a circuit diagram showing a configuration of a bistable circuit in a variant of the embodiment.

Furthermore, the configuration of a thin film transistor T6 in the above-described embodiment may be such that the gate and drain terminals of the thin film transistor are short-circuited (i.e., a diode-connected configuration). In other words, the configuration may include a thin film transistor T7 shown in FIG. 7, instead of the thin film transistor T6 shown in FIG. 1. In the case of this configuration, when the potential of a set signal SET, i.e., the gate potential of the thin film transistor T7, is brought to VGH, the thin film transistor T7 is placed in an on state and thus the source potential thereof, i.e., the potential of a netZ, is brought to VGH.

In addition, although, in the above-described embodiment, description is made assuming that the potential of the power supply lines VDD connected to the drain terminals of the thin film transistors T1 and T6 and the potential on the high-level side of the first clock CKA and the second clock CKB are both VGH, those potentials may be set to different values.

Furthermore, the present invention is not limited to the above-described embodiments and various changes may be made within the scope defined by the claims. An embodiment obtained by appropriately combining technical means disclosed in different embodiments is also encompassed in the technical scope of the present invention.

DESCRIPTION OF REFERENCE NUMERALS

10: DISPLAY UNIT
15: DISPLAY SIGNAL GENERATING CIRCUIT
20: SYSTEM CONTROLLER
30: SOURCE DRIVER (VIDEO SIGNAL LINE DRIVE CIRCUIT)
40: GATE DRIVER (SCANNING SIGNAL LINE DRIVE CIRCUIT)
41 to 44: INPUT TERMINAL (OF BISTABLE CIRCUIT)
49: OUTPUT TERMINAL (OF BISTABLE CIRCUIT)
410: SHIFT REGISTER
SR(1) to SR(n): BISTABLE CIRCUIT
T1 to T7: THIN FILM TRANSISTOR
C1: CAPACITOR
GL1 to GLn: GATE BUS LINE
SL1 to SLm: SOURCE BUS LINE
GSP: GATE START PULSE SIGNAL
GEP: GATE END PULSE SIGNAL
GCK1: FIRST GATE CLOCK SIGNAL
GCK2: SECOND GATE CLOCK SIGNAL
CKA: FIRST CLOCK
CKB: SECOND CLOCK
GOUT(1) to GOUT(n): SCANNING SIGNAL
OUT: STATE SIGNAL
SET: SET SIGNAL
RST: RESET SIGNAL

The invention claimed is:

1. A shift register comprising a plurality of bistable circuits having a first state and a second state and connected in series with each other, the plurality of bistable circuits being sequentially placed in the first state based on two-phase clock signals including a first and a second clock signal, the first and second clock signals being provided from an external source of each bistable circuit and periodically repeating a high-level potential and a low-level potential, wherein
each bistable circuit includes:
an output node that outputs a state signal indicating either one of the first state and the second state;
a first transistor having a second electrode to which a high-level potential is provided, and a third electrode connected to the output node;
a second transistor having a first electrode to which the first clock signal is provided, and a third electrode connected to a first node connected to a first electrode of the first transistor;

a second node charge portion for charging a second node based on a state signal outputted from a bistable circuit of a previous stage of the bistable circuit, the second node being connected to a second electrode of the second transistor;

a second node discharge portion for discharging the second node based on a state signal outputted from a bistable circuit of a subsequent stage of the bistable circuit;

a first node discharge portion for discharging the first node based on the second clock signal; and an output node discharge portion for discharging the output node based on the second clock signal.

2. The shift register according to claim 1, wherein a channel area of the first transistor is larger than that of the second transistor.

3. The shift register according to claim 1, wherein each bistable circuit further includes a capacitor connected at its one end to the second node and connected at its other end to the output node.

4. The shift register according to claim 1, wherein
in each bistable circuit,
the second node discharge portion includes a third transistor having a first electrode to which a state signal outputted from a bistable circuit of a subsequent stage of the bistable circuit is provided, a second electrode to which the second node is connected, and a third electrode to which a low-level potential is provided,
the first node discharge portion includes a fourth transistor having a first electrode to which the second clock signal is provided, a second electrode to which the first node is connected, and a third electrode to which a low-level potential is provided, and
the output node discharge portion includes a fifth transistor having a first electrode to which the second clock signal is provided, a second electrode to which the output node is connected, and a third electrode to which a low-level potential is provided.

5. The shift register according to claim 1, wherein
in each bistable circuit,
the second node charge portion includes a sixth transistor having a first electrode to which a state signal outputted from a bistable circuit of a previous stage of the bistable circuit is provided, a second electrode to which a high-level potential is provided, and a third electrode to which the second node is connected.

6. The shift register according to claim 1, wherein
in each bistable circuit,
the second node charge portion includes a seventh transistor having a first electrode and a second electrode to which a state signal outputted from a bistable circuit of a previous stage of the bistable circuit is provided, and a third electrode to which the second node is connected.

7. The shift register according to claim 1, wherein the transistors included in each bistable circuit are all n-channel type thin film transistors.

8. A scanning signal line drive circuit of a display device that drives a plurality of scanning signal lines arranged in a display unit, the scanning signal line drive circuit comprising:
a shift register according to claim 1, wherein
the plurality of bistable circuits are provided so as to have a one-to-one correspondence with the plurality of scanning signal lines, and
each bistable circuit provides a state signal outputted from an output node, to its corresponding scanning signal line as a scanning signal.

9. A display device including the display unit and comprising a scanning signal line drive circuit according to claim 8.

10. A method of driving a shift register including a plurality of bistable circuits having a first state and a second state and connected in series with each other, the plurality of bistable circuits being sequentially placed in the first state based on two-phase clock signals including a first and a second clock signal, the first and second clock signals being provided from an external source of each bistable circuit and periodically repeating a high-level potential and a low-level potential, the method comprising:
a first driving step of bringing about a preliminary state for changing each bistable circuit from the second state to the first state;
a second driving step of placing a bistable circuit being in the preliminary state, in the first state; and
a third driving step of changing each bistable circuit from the first state to the second state, wherein
each bistable circuit includes:
an output node that outputs a state signal indicating either one of the first state and the second state;
a first transistor having a second electrode to which a high-level potential is provided, and a third electrode connected to the output node;
a second transistor having a first electrode to which the first clock signal is provided, a third electrode connected to a first node connected to a first electrode of the first transistor, and a smaller channel area than the first transistor;
a second node charge portion for charging a second node based on a predetermined set signal, the second node being connected to a second electrode of the second transistor;
a second node discharge portion for discharging the second node based on a predetermined reset signal;
a first node discharge portion for discharging the first node based on the second clock signal; and
an output node discharge portion for discharging the output node based on the second clock signal,
in the first driving step, the second node is charged by the second node charge portion based on the set signal,
in the second driving step, the first node is charged by the second transistor being placed in a conducting state based on the first clock signal, and
in the third driving step, the second node is discharged by the second node discharge portion based on the reset signal, and the first node is discharged by the first node discharge portion and the output node is discharged by the output node discharge portion, based on the second clock signal.

11. The method according to claim 10, wherein
in each bistable circuit,
the second node discharge portion includes a third transistor having a first electrode to which the reset signal is provided, a second electrode to which the second node is connected, and a third electrode to which a low-level potential is provided,
the first node discharge portion includes a fourth transistor having a first electrode to which the second clock signal is provided, a second electrode to which the first node is connected, and a third electrode to which a low-level potential is provided, and
the output node discharge portion includes a fifth transistor having a first electrode to which the second clock signal is provided, a second electrode to which the output node is connected, and a third electrode to which a low-level potential is provided, and
in the third driving step,
the third transistor is placed in a conducting state based on the reset signal, and the fourth transistor is placed in a conducting state and the fifth transistor is placed in a conducting state, based on the second clock signal.

12. The method according to claim 10, wherein the second node charge portion includes a sixth transistor having a first electrode to which the set signal is provided, a second electrode to which a high-level potential is provided, and a third electrode to which the second node is connected, and in the first driving step, the sixth transistor is placed in a conducting state based on the set signal.

13. The method according to claim 10, wherein the second node charge portion includes a seventh transistor having a first electrode and a second electrode to which the set signal is provided, and a third electrode to which the second node is connected, and in the first driving step, the seventh transistor is placed in a conducting state based on the set signal.

\* \* \* \* \*